(12) United States Patent
Park et al.

(10) Patent No.: US 9,368,364 B2
(45) Date of Patent: Jun. 14, 2016

(54) SILICON ETCH PROCESS WITH TUNABLE SELECTIVITY TO SIO$_2$ AND OTHER MATERIALS

(71) Applicant: Applied Materials, Inc., Santa Clara, CA (US)

(72) Inventors: Seung Park, San Jose, CA (US); Anchuan Wang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/566,291

(22) Filed: Dec. 10, 2014

(65) Prior Publication Data

US 2016/0086807 A1 Mar. 24, 2016

Related U.S. Application Data

(60) Provisional application No. 62/054,860, filed on Sep. 24, 2014.

(51) Int. Cl.
*H01L 21/3065* (2006.01)
*H01J 37/32* (2006.01)

(52) U.S. Cl.
CPC ....... *H01L 21/3065* (2013.01); *H01J 37/32449* (2013.01)

(58) Field of Classification Search
None
See application file for complete search history.

(56) References Cited

U.S. PATENT DOCUMENTS

| | | |
|---|---|---|
| 2,369,620 A | 2/1945 | Sullivan et al. |
| 3,451,840 A | 6/1969 | Hough |
| 3,937,857 A | 2/1976 | Brummett et al. |
| 3,969,077 A | 7/1976 | Hill |
| 4,006,047 A | 2/1977 | Brummett et al. |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,361,441 A | 11/1982 | Tylko |
| 4,364,803 A | 12/1982 | Nidola et al. |
| 4,368,223 A | 1/1983 | Kobayashi et al. |
| 4,374,698 A | 2/1983 | Sanders et al. |
| 4,397,812 A | 8/1983 | Mallory, Jr. |
| 4,468,413 A | 8/1984 | Bachmann |
| 4,565,601 A | 1/1986 | Kakehi et al. |
| 4,579,618 A | 4/1986 | Celestino et al. |
| 4,585,920 A | 4/1986 | Hoog et al. |
| 4,625,678 A | 12/1986 | Shloya et al. |
| 4,632,857 A | 12/1986 | Mallory, Jr. |
| 4,656,052 A | 4/1987 | Satou et al. |
| 4,690,746 A | 9/1987 | McInerney et al. |

(Continued)

*Primary Examiner* — Allan Olsen

(74) *Attorney, Agent, or Firm* — Kilpatrick Townsend & Stockton LLP

(57) ABSTRACT

A tunable plasma etch process includes generating a plasma in a controlled flow of a source gas including NH$_3$ and NF$_3$ to form a stream of plasma products, controlling a flow of un-activated NH$_3$ that is added to the stream of plasma products to form an etch gas stream; and controlling pressure of the etch gas stream by adjusting at least one of the controlled flow of the source gas and the flow of un-activated NH$_3$ until the pressure is within a tolerance of a desired pressure. An etch rate of at least one of polysilicon and silicon dioxide by the etch gas stream is adjustable by varying a ratio of the controlled flow of the source gas to the flow of un-activated NH$_3$.

12 Claims, 7 Drawing Sheets

(56) References Cited

U.S. PATENT DOCUMENTS

| | | |
|---|---|---|
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,828,649 A | 5/1989 | Davis |
| 4,838,990 A | 6/1989 | Jucha et al. |
| 4,851,370 A | 7/1989 | Doklan et al. |
| 4,857,140 A | 8/1989 | Loewenstein |
| 4,865,685 A | 9/1989 | Palmour |
| 4,868,071 A | 9/1989 | Walsh et al. |
| 4,872,947 A | 10/1989 | Wang et al. |
| 4,878,994 A | 11/1989 | Jucha et al. |
| 4,886,570 A | 12/1989 | Davis et al. |
| 4,892,753 A | 1/1990 | Wang et al. |
| 4,894,352 A | 1/1990 | Lane et al. |
| 4,904,341 A | 2/1990 | Blaugher et al. |
| 4,904,621 A | 2/1990 | Lowenstein et al. |
| 4,913,929 A | 4/1990 | Moslehi et al. |
| 4,946,903 A | 8/1990 | Gardella et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,992,136 A | 2/1991 | Tachi et al. |
| 4,994,404 A | 2/1991 | Sheng et al. |
| 5,000,113 A | 3/1991 | Wang et al. |
| 5,013,691 A | 5/1991 | Lory et al. |
| 5,028,565 A | 7/1991 | Chang |
| 5,030,319 A | 7/1991 | Nishino et al. |
| 5,061,838 A | 10/1991 | Lane et al. |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,180,435 A | 1/1993 | Markunas et al. |
| 5,186,718 A | 2/1993 | Tepman et al. |
| 5,188,706 A | 2/1993 | Hori et al. |
| 5,198,034 A | 3/1993 | deBoer et al. |
| 5,203,911 A | 4/1993 | Sricharoenchalkit et al. |
| 5,215,787 A | 6/1993 | Homma |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,371 A | 9/1993 | Maher et al. |
| 5,248,527 A | 9/1993 | Uchida et al. |
| 5,252,178 A | 10/1993 | Moslehi |
| 5,266,157 A | 11/1993 | Kadomura |
| 5,270,125 A | 12/1993 | America et al. |
| 5,271,972 A | 12/1993 | Kwok et al. |
| 5,275,977 A | 1/1994 | Otsubo et al. |
| 5,279,669 A | 1/1994 | Lee |
| 5,279,865 A | 1/1994 | Chebi et al. |
| 5,288,518 A | 2/1994 | Homma |
| 5,290,382 A | 3/1994 | Zarowin et al. |
| 5,300,463 A | 4/1994 | Cathey et al. |
| 5,302,233 A | 4/1994 | Kim et al. |
| 5,306,530 A | 4/1994 | Strongin et al. |
| 5,314,724 A | 5/1994 | Tsukune et al. |
| 5,319,247 A | 6/1994 | Matsuura |
| 5,326,427 A | 7/1994 | Jerbic |
| 5,328,218 A | 7/1994 | Lowrey et al. |
| 5,328,558 A | 7/1994 | Kawamura et al. |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,368,897 A | 11/1994 | Kurihara et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,670 A | 5/1995 | Langan et al. |
| 5,413,967 A | 5/1995 | Matsuda et al. |
| 5,415,890 A | 5/1995 | Kloiber et al. |
| 5,416,048 A | 5/1995 | Blalock et al. |
| 5,420,075 A | 5/1995 | Homma et al. |
| 5,429,995 A | 7/1995 | Nishiyama et al. |
| 5,439,553 A | 8/1995 | Grant et al. |
| 5,451,259 A | 9/1995 | Krogh |
| 5,468,342 A | 11/1995 | Nulty et al. |
| 5,474,589 A | 12/1995 | Ohga et al. |
| 5,478,403 A | 12/1995 | Shinigawa et al. |
| 5,478,462 A | 12/1995 | Walsh |
| 5,483,920 A | 1/1996 | Pryor |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,518,962 A | 5/1996 | Murao |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,558,717 A | 9/1996 | Zhao et al. |
| 5,560,779 A | 10/1996 | Knowles et al. |
| 5,563,105 A | 10/1996 | Dobuzinsky et al. |
| 5,567,243 A | 10/1996 | Foster et al. |
| 5,571,576 A | 11/1996 | Qian et al. |
| 5,578,130 A | 11/1996 | Hayashi et al. |
| 5,578,161 A | 11/1996 | Auda |
| 5,580,421 A | 12/1996 | Hiatt et al. |
| 5,591,269 A | 1/1997 | Arami et al. |
| 5,599,740 A | 2/1997 | Jang et al. |
| 5,616,518 A | 4/1997 | Foo et al. |
| 5,624,582 A | 4/1997 | Cain |
| 5,626,922 A | 5/1997 | Miyanaga et al. |
| 5,628,829 A | 5/1997 | Foster et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,661,093 A | 8/1997 | Ravi et al. |
| 5,674,787 A | 10/1997 | Zhao et al. |
| 5,676,758 A | 10/1997 | Hasgawa et al. |
| 5,679,606 A | 10/1997 | Wang et al. |
| 5,685,946 A | 11/1997 | Fathauer et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,753,886 A | 5/1998 | Iwamura et al. |
| 5,755,859 A | 5/1998 | Brusic et al. |
| 5,756,400 A | 5/1998 | Ye et al. |
| 5,756,402 A | 5/1998 | Jimbo et al. |
| 5,772,770 A | 6/1998 | Suda et al. |
| 5,781,693 A | 7/1998 | Ballance et al. |
| 5,786,276 A | 7/1998 | Brooks et al. |
| 5,789,300 A | 8/1998 | Fulford |
| 5,800,686 A | 9/1998 | Littau et al. |
| 5,804,259 A | 9/1998 | Robles |
| 5,812,403 A | 9/1998 | Fong et al. |
| 5,814,365 A | 9/1998 | Mahawill |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |
| 5,843,538 A | 12/1998 | Ehrsam et al. |
| 5,843,847 A | 12/1998 | Pu et al. |

(56) References Cited

U.S. PATENT DOCUMENTS

| | | |
|---|---|---|
| 5,844,195 A | 12/1998 | Fairbairn et al. |
| 5,846,332 A | 12/1998 | Zhao et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,856,240 A | 1/1999 | Sinha et al. |
| 5,858,876 A | 1/1999 | Chew |
| 5,866,483 A | 2/1999 | Shiau et al. |
| 5,872,052 A | 2/1999 | Iyer |
| 5,872,058 A | 2/1999 | Van Cleemput et al. |
| 5,882,424 A | 3/1999 | Taylor et al. |
| 5,882,786 A | 3/1999 | Nassau et al. |
| 5,883,012 A | 3/1999 | Chiou |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,904,827 A | 5/1999 | Reynolds |
| 5,907,790 A | 5/1999 | Kellam |
| 5,910,340 A | 6/1999 | Uchida et al. |
| 5,913,147 A | 6/1999 | Dubin et al. |
| 5,915,190 A | 6/1999 | Pirkle |
| 5,918,116 A | 6/1999 | Chittipeddi |
| 5,920,792 A | 7/1999 | Lin |
| 5,926,737 A | 7/1999 | Ameen et al. |
| 5,932,077 A | 8/1999 | Reynolds |
| 5,933,757 A | 8/1999 | Yoshikawa et al. |
| 5,935,334 A | 8/1999 | Fong et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,902 A | 8/1999 | Redeker et al. |
| 5,948,702 A | 9/1999 | Rotondaro |
| 5,951,601 A | 9/1999 | Lesinski et al. |
| 5,951,776 A | 9/1999 | Selyutin et al. |
| 5,951,896 A | 9/1999 | Mahawill |
| 5,953,591 A | 9/1999 | Ishihara et al. |
| 5,953,635 A | 9/1999 | Andideh |
| 5,968,610 A | 10/1999 | Liu et al. |
| 5,969,422 A | 10/1999 | Ting et al. |
| 5,976,327 A | 11/1999 | Tanaka |
| 5,990,000 A | 11/1999 | Hong et al. |
| 5,990,013 A | 11/1999 | Berenguer et al. |
| 5,993,916 A | 11/1999 | Zhao et al. |
| 6,004,884 A | 12/1999 | Abraham |
| 6,007,635 A | 12/1999 | Mahawill |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,020,271 A | 2/2000 | Yanagida |
| 6,030,666 A | 2/2000 | Lam et al. |
| 6,030,881 A | 2/2000 | Papasouliotis et al. |
| 6,035,101 A | 3/2000 | Sajoto et al. |
| 6,037,018 A | 3/2000 | Jang et al. |
| 6,037,266 A | 3/2000 | Tao et al. |
| 6,039,851 A | 3/2000 | Iyer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,072,147 A | 6/2000 | Koshiishi |
| 6,072,227 A | 6/2000 | Yau et al. |
| 6,077,780 A | 6/2000 | Dubin |
| 6,080,529 A | 6/2000 | Ye et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,090,212 A | 7/2000 | Mahawill |
| 6,093,457 A | 7/2000 | Okumura |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,836 A | 8/2000 | Cohen et al. |
| 6,110,838 A | 8/2000 | Loewenstein |
| 6,113,771 A | 9/2000 | Landau et al. |
| 6,117,245 A | 9/2000 | Mandrekar et al. |
| 6,120,640 A | 9/2000 | Shih et al. |
| 6,136,163 A | 10/2000 | Cheung et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,149,828 A | 11/2000 | Vaartstra |
| 6,150,628 A | 11/2000 | Smith et al. |
| 6,153,935 A | 11/2000 | Edelstein et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,171,661 B1 | 1/2001 | Zheng et al. |
| 6,174,450 B1 | 1/2001 | Patrick et al. |
| 6,174,812 B1 | 1/2001 | Hsuing et al. |
| 6,176,198 B1 | 1/2001 | Kao et al. |
| 6,176,667 B1 | 1/2001 | Fairbairn |
| 6,177,245 B1 | 1/2001 | Ward et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,184,121 B1 | 2/2001 | Buchwalter et al. |
| 6,189,483 B1 | 2/2001 | Ishikawa et al. |
| 6,190,233 B1 | 2/2001 | Hong et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,203,863 B1 | 3/2001 | Liu et al. |
| 6,204,200 B1 | 3/2001 | Shieh et al. |
| 6,217,658 B1 | 4/2001 | Orczyk et al. |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,237,527 B1 | 5/2001 | Kellerman et al. |
| 6,238,513 B1 | 5/2001 | Arnold et al. |
| 6,238,582 B1 | 5/2001 | Williams et al. |
| 6,241,845 B1 | 6/2001 | Gadgil et al. |
| 6,242,349 B1 | 6/2001 | Nogami et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,277,733 B1 | 8/2001 | Smith |
| 6,277,752 B1 | 8/2001 | Chen |
| 6,277,763 B1 | 8/2001 | Kugimiya et al. |
| 6,281,072 B1 | 8/2001 | Li et al. |
| 6,281,135 B1 | 8/2001 | Han et al. |
| 6,291,282 B1 | 9/2001 | Wilk et al. |
| 6,291,348 B1 | 9/2001 | Lopatin et al. |
| 6,303,044 B1 | 10/2001 | Koemtzopoulos |
| 6,303,418 B1 | 10/2001 | Cha et al. |
| 6,306,772 B1 | 10/2001 | Lin |
| 6,312,554 B1 | 11/2001 | Ye |
| 6,312,995 B1 | 11/2001 | Yu |
| 6,319,387 B1 | 11/2001 | Krishnamoorthy et al. |
| 6,322,716 B1 | 11/2001 | Qiao et al. |
| 6,323,128 B1 | 11/2001 | Sambucetti et al. |
| 6,335,288 B1 | 1/2002 | Kwan et al. |

(56) References Cited

U.S. PATENT DOCUMENTS

| | | |
|---|---|---|
| 6,340,435 B1 | 1/2002 | Bjorkman et al. |
| 6,342,733 B1 | 1/2002 | Hu et al. |
| RE37,546 E | 2/2002 | Mahawili |
| 6,344,410 B1 | 2/2002 | Lopatin et al. |
| 6,350,320 B1 | 2/2002 | Sherstinsky et al. |
| 6,350,697 B1 | 2/2002 | Richardson |
| 6,351,013 B1 | 2/2002 | Luning et al. |
| 6,352,081 B1 | 3/2002 | Lu et al. |
| 6,355,573 B1 | 3/2002 | Okumura |
| 6,364,949 B1 | 4/2002 | Or et al. |
| 6,364,954 B2 | 4/2002 | Umotoy et al. |
| 6,364,957 B1 | 4/2002 | Schneider et al. |
| 6,375,748 B1 | 4/2002 | Yudovsky et al. |
| 6,376,386 B1 | 4/2002 | Oshima |
| 6,379,575 B1 | 4/2002 | Yin et al. |
| 6,383,951 B1 | 5/2002 | Li |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,415,736 B1 | 7/2002 | Hao et al. |
| 6,416,647 B1 | 7/2002 | Dordi et al. |
| 6,418,874 B1 | 7/2002 | Cox et al. |
| 6,423,284 B1 | 7/2002 | Arno |
| 6,427,623 B2 | 8/2002 | Ko |
| 6,432,819 B1 | 8/2002 | Pavate et al. |
| 6,432,831 B2 | 8/2002 | Dhindsa et al. |
| 6,436,193 B1 | 8/2002 | Kasai et al. |
| 6,436,816 B1 | 8/2002 | Lee et al. |
| 6,440,863 B1 | 8/2002 | Tsai et al. |
| 6,441,492 B1 | 8/2002 | Cunningham |
| 6,446,572 B1 | 9/2002 | Brcka |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,465,366 B1 | 10/2002 | Nemani et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,509,623 B2 | 1/2003 | Zhao |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,558,564 B1 | 5/2003 | Loewenhardt |
| 6,565,729 B2 | 5/2003 | Chen et al. |
| 6,569,773 B1 | 5/2003 | Gellrich et al. |
| 6,573,030 B1 | 6/2003 | Fairbairn et al. |
| 6,573,606 B2 | 6/2003 | Sambucetti et al. |
| 6,586,163 B1 | 7/2003 | Okabe et al. |
| 6,596,599 B1 | 7/2003 | Guo |
| 6,596,654 B1 | 7/2003 | Bayman et al. |
| 6,602,434 B1 | 8/2003 | Hung et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,578 B1 | 10/2003 | Xu et al. |
| 6,638,810 B2 | 10/2003 | Bakli et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,663,715 B1 | 12/2003 | Yuda et al. |
| 6,677,242 B1 | 1/2004 | Liu et al. |
| 6,679,981 B1 | 1/2004 | Pan et al. |
| 6,688,375 B1 | 2/2004 | Turner |
| 6,713,356 B1 | 3/2004 | Skotnicki et al. |
| 6,713,835 B1 | 3/2004 | Horak et al. |
| 6,717,189 B2 | 4/2004 | Inoue et al. |
| 6,720,213 B1 | 4/2004 | Gambino et al. |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,767,834 B2 | 7/2004 | Chung et al. |
| 6,772,827 B2 | 8/2004 | Keller et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,800,336 B1 | 10/2004 | Fornsel et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,748 B2 | 10/2004 | Kapoor et al. |
| 6,821,571 B2 | 11/2004 | Huang |
| 6,823,589 B2 | 11/2004 | White et al. |
| 6,830,624 B2 | 12/2004 | Janakiraman et al. |
| 6,835,995 B2 | 12/2004 | Li |
| 6,846,745 B1 | 1/2005 | Papasouliotis et al. |
| 6,852,550 B2 | 2/2005 | Tuttle et al. |
| 6,858,153 B2 | 2/2005 | Bjorkman et al. |
| 6,861,097 B1 | 3/2005 | Goosey et al. |
| 6,861,332 B2 | 3/2005 | Park et al. |
| 6,869,880 B2 | 3/2005 | Krishnaraj et al. |
| 6,875,280 B2 | 4/2005 | Ikeda et al. |
| 6,878,206 B2 | 4/2005 | Tzu et al. |
| 6,879,981 B2 | 4/2005 | Rothschild et al. |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,921,556 B2 | 7/2005 | Shimizu et al. |
| 6,924,191 B2 | 8/2005 | Liu et al. |
| 6,930,047 B2 | 8/2005 | Yamazaki |
| 6,942,753 B2 | 9/2005 | Choi et al. |
| 6,946,033 B2 | 9/2005 | Tsuei et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,995,073 B2 | 2/2006 | Liou |
| 7,017,269 B2 | 3/2006 | White et al. |
| 7,018,941 B2 | 3/2006 | Cui et al. |
| 7,030,034 B2 | 4/2006 | Fucsko et al. |
| 7,049,200 B2 | 5/2006 | Arghavani et al. |
| 7,071,532 B2 | 7/2006 | Geffken et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,145,725 B2 | 12/2006 | Hasel et al. |
| 7,148,155 B1 | 12/2006 | Tarafdar et al. |
| 7,166,233 B2 | 1/2007 | Johnson et al. |
| 7,183,214 B2 | 2/2007 | Nam et al. |
| 7,196,342 B2 | 3/2007 | Ershov et al. |
| 7,226,805 B2 | 6/2007 | Hallin et al. |
| 7,235,137 B2 | 6/2007 | Kitayama et al. |
| 7,252,716 B2 | 8/2007 | Kim et al. |
| 7,253,123 B2 | 8/2007 | Arghavani et al. |
| 7,256,370 B2 | 8/2007 | Guiver |
| 7,288,482 B2 | 10/2007 | Panda et al. |
| 7,341,633 B2 | 3/2008 | Lubomirsky et al. |

(56) References Cited

U.S. PATENT DOCUMENTS

| | | | |
|---|---|---|---|
| 7,358,192 B2 | 4/2008 | Merry et al. |
| 7,364,956 B2 | 4/2008 | Saito |
| 7,365,016 B2 | 4/2008 | Ouellet et al. |
| 7,396,480 B2 | 7/2008 | Kao et al. |
| 7,416,989 B1 | 8/2008 | Liu et al. |
| 7,465,358 B2 | 12/2008 | Weidman et al. |
| 7,468,319 B2 | 12/2008 | Lee |
| 7,484,473 B2 | 2/2009 | Keller et al. |
| 7,488,688 B2 | 2/2009 | Seung-Pil et al. |
| 7,494,545 B2 | 2/2009 | Lam et al. |
| 7,500,445 B2 | 3/2009 | Zhao et al. |
| 7,553,756 B2 | 6/2009 | Hayashi et al. |
| 7,575,007 B2 | 8/2009 | Tang et al. |
| 7,581,511 B2 | 9/2009 | Mardian et al. |
| 7,604,708 B2 | 10/2009 | Wood et al. |
| 7,628,897 B2 | 12/2009 | Mungekar et al. |
| 7,682,518 B2 | 3/2010 | Chandrachood et al. |
| 7,708,859 B2 | 5/2010 | Huang et al. |
| 7,722,925 B2 | 5/2010 | White et al. |
| 7,723,221 B2 | 5/2010 | Hayashi |
| 7,749,326 B2 | 7/2010 | Kim et al. |
| 7,785,672 B2 | 8/2010 | Choi et al. |
| 7,790,634 B2 | 9/2010 | Munro et al. |
| 7,806,078 B2 | 10/2010 | Yoshida |
| 7,807,578 B2 | 10/2010 | Bencher et al. |
| 7,825,038 B2 | 11/2010 | Ingle et al. |
| 7,837,828 B2 | 11/2010 | Ikeda et al. |
| 7,915,139 B1 | 3/2011 | Lang et al. |
| 7,932,181 B2 | 4/2011 | Singh et al. |
| 7,939,422 B2 | 5/2011 | Ingle et al. |
| 7,968,441 B2 | 6/2011 | Xu |
| 7,976,631 B2 | 7/2011 | Burrows |
| 7,981,806 B2 | 7/2011 | Jung |
| 7,989,365 B2 | 8/2011 | Park et al. |
| 8,008,166 B2 | 8/2011 | Sanchez et al. |
| 8,058,179 B1 | 11/2011 | Draeger et al. |
| 8,071,482 B2 | 12/2011 | Kawada |
| 8,074,599 B2 | 12/2011 | Choi et al. |
| 8,076,198 B2 | 12/2011 | Lee et al. |
| 8,083,853 B2 | 12/2011 | Choi et al. |
| 8,119,530 B2 | 2/2012 | Hori et al. |
| 8,133,349 B1 | 3/2012 | Panagopoulos |
| 8,187,486 B1 | 5/2012 | Liu et al. |
| 8,211,808 B2 | 7/2012 | Sapre et al. |
| 8,298,627 B2 | 10/2012 | Minami et al. |
| 8,309,440 B2 | 11/2012 | Sanchez et al. |
| 8,313,610 B2 | 11/2012 | Dhindsa |
| 8,328,939 B2 | 12/2012 | Choi et al. |
| 8,368,308 B2 | 2/2013 | Banna et al. |
| 8,427,067 B2 | 4/2013 | Espiau et al. |
| 8,435,902 B2 | 5/2013 | Tang et al. |
| 8,475,674 B2 | 7/2013 | Thadani et al. |
| 8,491,805 B2 | 7/2013 | Kushibiki et al. |
| 8,501,629 B2 | 8/2013 | Tang et al. |
| 8,506,713 B2 | 8/2013 | Takagi |
| 8,512,509 B2 | 8/2013 | Bera et al. |
| 8,551,891 B2 | 10/2013 | Liang |
| 8,573,152 B2 | 11/2013 | De La Llera |
| 8,623,148 B2 | 1/2014 | Mitchell et al. |
| 8,623,471 B2 | 1/2014 | Tyler et al. |
| 8,642,481 B2 | 2/2014 | Wang et al. |
| 8,679,982 B2 | 3/2014 | Wang et al. |
| 8,679,983 B2 | 3/2014 | Wang et al. |
| 8,741,778 B2 | 6/2014 | Yang et al. |
| 8,747,680 B1 | 6/2014 | Deshpande |
| 8,765,574 B2 | 7/2014 | Zhang et al. |
| 8,771,536 B2 | 7/2014 | Zhang et al. |
| 8,771,539 B2 | 7/2014 | Zhang et al. |
| 8,772,888 B2 | 7/2014 | Jung et al. |
| 8,778,079 B2 | 7/2014 | Begarney et al. |
| 8,801,952 B1 | 8/2014 | Wang et al. |
| 8,808,563 B2 | 8/2014 | Wang et al. |
| 8,846,163 B2 | 9/2014 | Kao et al. |
| 8,895,449 B1 | 11/2014 | Zhu et al. |
| 8,900,364 B2 | 12/2014 | Wright |
| 8,921,234 B2 | 12/2014 | Liu et al. |
| 8,927,390 B2 | 1/2015 | Sapre et al. |
| 8,951,429 B1 | 2/2015 | Liu et al. |
| 8,956,980 B1 | 2/2015 | Chen et al. |
| 8,969,212 B2 | 3/2015 | Ren et al. |
| 8,980,005 B2 | 3/2015 | Carlson et al. |
| 8,980,758 B1 | 3/2015 | Ling et al. |
| 8,980,763 B2 | 3/2015 | Wang et al. |
| 8,992,733 B2 | 3/2015 | Sorensen et al. |
| 8,999,656 B2 | 4/2015 | Zhang et al. |
| 8,999,839 B2 | 4/2015 | Su et al. |
| 8,999,856 B2 | 4/2015 | Zhang |
| 9,012,302 B2 | 4/2015 | Sapre et al. |
| 9,017,481 B1 | 4/2015 | Pettinger et al. |
| 9,023,732 B2 | 5/2015 | Wang et al. |
| 9,023,734 B2 | 5/2015 | Chen et al. |
| 9,034,770 B2 | 5/2015 | Park et al. |
| 9,040,422 B2 | 5/2015 | Wang et al. |
| 9,064,815 B2 | 6/2015 | Zhang et al. |
| 9,064,816 B2 | 6/2015 | Kim et al. |
| 9,072,158 B2 | 6/2015 | Ikeda et al. |
| 9,093,371 B2 | 7/2015 | Wang et al. |
| 9,093,390 B2 | 7/2015 | Wang et al. |
| 9,111,877 B2 | 8/2015 | Chen et al. |
| 9,111,907 B2 | 8/2015 | Kamineni |
| 9,114,438 B2 | 8/2015 | Hoinkis et al. |
| 9,117,855 B2 | 8/2015 | Cho et al. |
| 9,132,436 B2 | 9/2015 | Liang et al. |
| 9,136,273 B1 * | 9/2015 | Purayath ............... H01L 27/115 |
| 9,144,147 B2 | 9/2015 | Yang et al. |
| 9,153,442 B2 | 10/2015 | Wang et al. |
| 9,159,606 B1 * | 10/2015 | Purayath ............. H01L 21/7682 |
| 9,165,786 B1 * | 10/2015 | Purayath ........... H01L 21/31116 |
| 9,184,055 B2 | 11/2015 | Wang et al. |
| 9,190,293 B2 | 11/2015 | Wang et al. |
| 9,209,012 B2 | 12/2015 | Chen et al. |
| 9,236,265 B2 | 1/2016 | Korolik et al. |
| 9,245,762 B2 | 1/2016 | Zhang et al. |
| 2001/0008803 A1 | 7/2001 | Takamatsu et al. |
| 2001/0015261 A1 | 8/2001 | Kobayashi et al. |
| 2001/0028093 A1 | 10/2001 | Yamazaki et al. |
| 2001/0028922 A1 | 10/2001 | Sandhu |
| 2001/0030366 A1 | 10/2001 | Nakano et al. |
| 2001/0034106 A1 | 10/2001 | Moise et al. |
| 2001/0034121 A1 | 10/2001 | Fu et al. |
| 2001/0036706 A1 | 11/2001 | Kitamura |
| 2001/0037856 A1 | 11/2001 | Park |
| 2001/0041444 A1 | 11/2001 | Shields et al. |
| 2001/0047760 A1 | 12/2001 | Moslehi |
| 2001/0053585 A1 | 12/2001 | Kikuchi et al. |
| 2001/0053610 A1 | 12/2001 | Athavale |
| 2001/0054381 A1 | 12/2001 | Umotoy et al. |
| 2001/0055842 A1 | 12/2001 | Uh et al. |
| 2002/0000202 A1 | 1/2002 | Yuda et al. |
| 2002/0011210 A1 | 1/2002 | Satoh et al. |
| 2002/0016080 A1 | 2/2002 | Khan et al. |
| 2002/0016085 A1 | 2/2002 | Huang et al. |
| 2002/0028582 A1 | 3/2002 | Nallan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0040764 A1 | 4/2002 | Kwan et al. |
| 2002/0040766 A1 | 4/2002 | Takahashi |
| 2002/0045966 A1 | 4/2002 | Lee et al. |
| 2002/0054962 A1 | 5/2002 | Huang |
| 2002/0069820 A1 | 6/2002 | Yudovsky |
| 2002/0070414 A1 | 6/2002 | Drescher et al. |
| 2002/0074573 A1 | 6/2002 | Takeuchi et al. |
| 2002/0090781 A1 | 7/2002 | Skotnicki et al. |
| 2002/0090835 A1 | 7/2002 | Chakravarti et al. |
| 2002/0096493 A1 | 7/2002 | Hattori |
| 2002/0098681 A1 | 7/2002 | Hu et al. |
| 2002/0106845 A1 | 8/2002 | Chao et al. |
| 2002/0124867 A1 | 9/2002 | Kim et al. |
| 2002/0129769 A1 | 9/2002 | Kim et al. |
| 2002/0153808 A1 | 10/2002 | Skotnicki et al. |
| 2002/0164885 A1 | 11/2002 | Lill et al. |
| 2002/0177322 A1 | 11/2002 | Li et al. |

(56) References Cited

U.S. PATENT DOCUMENTS

| | | |
|---|---|---|
| 2002/0187280 A1 | 12/2002 | Johnson et al. |
| 2002/0187655 A1 | 12/2002 | Tan et al. |
| 2003/0003757 A1 | 1/2003 | Naltan et al. |
| 2003/0010645 A1 | 1/2003 | Ting et al. |
| 2003/0019428 A1 | 1/2003 | Ku et al. |
| 2003/0019580 A1 | 1/2003 | Strang |
| 2003/0026060 A1 | 2/2003 | Hiramatsu et al. |
| 2003/0029566 A1 | 2/2003 | Roth |
| 2003/0029715 A1 | 2/2003 | Yu et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0050724 A1 | 3/2003 | M'Saad et al. |
| 2003/0054608 A1 | 3/2003 | Tseng et al. |
| 2003/0072639 A1 | 4/2003 | White et al. |
| 2003/0075808 A1 | 4/2003 | Inoue et al. |
| 2003/0077909 A1 | 4/2003 | Jiwari |
| 2003/0079686 A1 | 5/2003 | Chen et al. |
| 2003/0087531 A1 | 5/2003 | Kang et al. |
| 2003/0091938 A1 | 5/2003 | Fairbairn et al. |
| 2003/0098125 A1 | 5/2003 | An |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0121608 A1 | 7/2003 | Chen et al. |
| 2003/0124465 A1 | 7/2003 | Lee et al. |
| 2003/0124842 A1 | 7/2003 | Hytros et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0140844 A1 | 7/2003 | Maa et al. |
| 2003/0143328 A1 | 7/2003 | Chen et al. |
| 2003/0148035 A1 | 8/2003 | Lingampalli |
| 2003/0152691 A1 | 8/2003 | Baude |
| 2003/0159307 A1 | 8/2003 | Sago et al. |
| 2003/0173333 A1 | 9/2003 | Wang et al. |
| 2003/0173347 A1 | 9/2003 | Guiver |
| 2003/0173675 A1 | 9/2003 | Watanabe |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0199170 A1 | 10/2003 | Li |
| 2003/0205329 A1 | 11/2003 | Gujer et al. |
| 2003/0215963 A1 | 11/2003 | AmRhein et al. |
| 2003/0216044 A1 | 11/2003 | Lin et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2004/0005726 A1 | 1/2004 | Huang |
| 2004/0020801 A1 | 2/2004 | Zhao et al. |
| 2004/0026371 A1 | 2/2004 | Nguyen et al. |
| 2004/0033678 A1 | 2/2004 | Arghavani et al. |
| 2004/0033684 A1 | 2/2004 | Li |
| 2004/0050328 A1 | 3/2004 | Kumagai et al. |
| 2004/0058293 A1 | 3/2004 | Nguyen et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0079728 A1 | 4/2004 | Mungekar et al. |
| 2004/0092063 A1 | 5/2004 | Okumura |
| 2004/0099378 A1 | 5/2004 | Kim et al. |
| 2004/0101667 A1 | 5/2004 | O'Loughlin et al. |
| 2004/0115876 A1 | 6/2004 | Goundar et al. |
| 2004/0129671 A1 | 7/2004 | Ji et al. |
| 2004/0137161 A1 | 7/2004 | Segawa et al. |
| 2004/0144490 A1 | 7/2004 | Zhao et al. |
| 2004/0147126 A1 | 7/2004 | Yamashita et al. |
| 2004/0152342 A1 | 8/2004 | Li |
| 2004/0154535 A1 | 8/2004 | Chen et al. |
| 2004/0157444 A1 | 8/2004 | Chiu |
| 2004/0175929 A1 | 9/2004 | Schmitt et al. |
| 2004/0182315 A1 | 9/2004 | Laflamme et al. |
| 2004/0192032 A1 | 9/2004 | Ohmori et al. |
| 2004/0194799 A1 | 10/2004 | Kim et al. |
| 2004/0200499 A1 | 10/2004 | Harvey |
| 2004/0211357 A1 | 10/2004 | Gadgil et al. |
| 2004/0219737 A1 | 11/2004 | Quon |
| 2004/0219789 A1 | 11/2004 | Wood et al. |
| 2004/0263827 A1 | 12/2004 | Xu |
| 2005/0001276 A1 | 1/2005 | Gao et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0051094 A1 | 3/2005 | Schaepkens et al. |
| 2005/0073051 A1 | 4/2005 | Yamamoto et al. |
| 2005/0079706 A1 | 4/2005 | Kumar et al. |
| 2005/0085031 A1 | 4/2005 | Lopatin et al. |
| 2005/0090120 A1 | 4/2005 | Hasegawa et al. |
| 2005/0098111 A1 | 5/2005 | Shimizu et al. |
| 2005/0105991 A1 | 5/2005 | Hofmeister et al. |
| 2005/0112901 A1 | 5/2005 | Ji et al. |
| 2005/0164479 A1 | 7/2005 | Perng et al. |
| 2005/0167394 A1 | 8/2005 | Liu et al. |
| 2005/0181588 A1 | 8/2005 | Kim |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0214477 A1 | 9/2005 | Hanawa et al. |
| 2005/0218507 A1 | 10/2005 | Kao et al. |
| 2005/0221552 A1 | 10/2005 | Kao et al. |
| 2005/0230350 A1 | 10/2005 | Kao et al. |
| 2005/0236694 A1 | 10/2005 | Wu et al. |
| 2005/0239282 A1 | 10/2005 | Chen et al. |
| 2005/0251990 A1 | 11/2005 | Choi et al. |
| 2005/0266622 A1 | 12/2005 | Arghavani et al. |
| 2005/0266691 A1 | 12/2005 | Gu et al. |
| 2005/0269030 A1 | 12/2005 | Kent et al. |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0006057 A1 | 1/2006 | Laermer |
| 2006/0011298 A1 | 1/2006 | Lim et al. |
| 2006/0016783 A1 | 1/2006 | Wu et al. |
| 2006/0019456 A1 | 1/2006 | Bu et al. |
| 2006/0019486 A1 | 1/2006 | Yu et al. |
| 2006/0021574 A1 | 2/2006 | Armour et al. |
| 2006/0024954 A1 | 2/2006 | Wu et al. |
| 2006/0024956 A1 | 2/2006 | Zhijian et al. |
| 2006/0033678 A1 | 2/2006 | Lubomirsky et al. |
| 2006/0040055 A1 | 2/2006 | Nguyen et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0060942 A1 | 3/2006 | Minixhofer et al. |
| 2006/0062897 A1 | 3/2006 | Gu et al. |
| 2006/0093756 A1 | 5/2006 | Rajagopalan et al. |
| 2006/0097397 A1 | 5/2006 | Russell |
| 2006/0102076 A1 | 5/2006 | Smith et al. |
| 2006/0102587 A1 | 5/2006 | Kimura |
| 2006/0121724 A1 | 6/2006 | Yue et al. |
| 2006/0124242 A1 | 6/2006 | Kanarik et al. |
| 2006/0130971 A1 | 6/2006 | Chang et al. |
| 2006/0157449 A1 | 7/2006 | Takahashi et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0178008 A1 | 8/2006 | Yeh et al. |
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0210723 A1 | 9/2006 | Ishizaka |
| 2006/0216878 A1 | 9/2006 | Lee |
| 2006/0222481 A1 | 10/2006 | Foree |
| 2006/0226121 A1 | 10/2006 | Aoi |

(56) References Cited

U.S. PATENT DOCUMENTS

| | | |
|---|---|---|
| 2006/0228889 A1 | 10/2006 | Edelberg et al. |
| 2006/0240661 A1 | 10/2006 | Annapragada et al. |
| 2006/0244107 A1 | 11/2006 | Sugihara |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0252265 A1 | 11/2006 | Jin et al. |
| 2006/0254716 A1* | 11/2006 | Mosden ............ H01L 21/0276 156/345.43 |
| 2006/0260750 A1 | 11/2006 | Rueger |
| 2006/0261490 A1 | 11/2006 | Su et al. |
| 2006/0264043 A1 | 11/2006 | Stewart et al. |
| 2006/0266288 A1 | 11/2006 | Choi |
| 2007/0004201 A1 | 1/2007 | Lubomirsky et al. |
| 2007/0025907 A1 | 2/2007 | Rezeq |
| 2007/0048977 A1 | 3/2007 | Lee et al. |
| 2007/0056925 A1 | 3/2007 | Liu et al. |
| 2007/0062453 A1 | 3/2007 | Ishikawa |
| 2007/0071888 A1 | 3/2007 | Shanmugasundram et al. |
| 2007/0072408 A1 | 3/2007 | Enomoto et al. |
| 2007/0090325 A1 | 4/2007 | Hwang et al. |
| 2007/0099428 A1 | 5/2007 | Shamiryan et al. |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0131274 A1 | 6/2007 | Stollwerck et al. |
| 2007/0154838 A1 | 7/2007 | Lee |
| 2007/0163440 A1 | 7/2007 | Kim et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0212288 A1 | 9/2007 | Holst |
| 2007/0227554 A1 | 10/2007 | Satoh et al. |
| 2007/0231109 A1 | 10/2007 | Pak et al. |
| 2007/0235134 A1 | 10/2007 | Iimuro |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0243693 A1 | 10/2007 | Nemani et al. |
| 2007/0259467 A1 | 11/2007 | Tweet et al. |
| 2007/0264820 A1 | 11/2007 | Liu |
| 2007/0266946 A1 | 11/2007 | Choi |
| 2007/0281106 A1 | 12/2007 | Lubomirsky et al. |
| 2007/0287292 A1 | 12/2007 | Li et al. |
| 2008/0020570 A1 | 1/2008 | Naik |
| 2008/0044990 A1 | 2/2008 | Lee |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0099147 A1 | 5/2008 | Myo et al. |
| 2008/0099431 A1 | 5/2008 | Kumar et al. |
| 2008/0099876 A1 | 5/2008 | Seto |
| 2008/0102570 A1 | 5/2008 | Fischer et al. |
| 2008/0102640 A1 | 5/2008 | Hassan et al. |
| 2008/0115726 A1 | 5/2008 | Ingle et al. |
| 2008/0121970 A1 | 5/2008 | Aritome |
| 2008/0124937 A1 | 5/2008 | Xu et al. |
| 2008/0142483 A1 | 6/2008 | Hua et al. |
| 2008/0153306 A1 | 6/2008 | Cho et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0171407 A1 | 7/2008 | Nakabayashi et al. |
| 2008/0182381 A1 | 7/2008 | Kiyotoshi |
| 2008/0182383 A1 | 7/2008 | Lee et al. |
| 2008/0202892 A1 | 8/2008 | Smith et al. |
| 2008/0230519 A1 | 9/2008 | Takahashi |
| 2008/0233709 A1 | 9/2008 | Conti et al. |
| 2008/0254635 A1 | 10/2008 | Benzel et al. |
| 2008/0261404 A1 | 10/2008 | Kozuka et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2009/0001480 A1 | 1/2009 | Cheng |
| 2009/0004849 A1 | 1/2009 | Eun |
| 2009/0017227 A1 | 1/2009 | Fu et al. |
| 2009/0045167 A1 | 2/2009 | Maruyama |
| 2009/0072401 A1 | 3/2009 | Arnold et al. |
| 2009/0081878 A1 | 3/2009 | Dhindsa |
| 2009/0084317 A1 | 4/2009 | Wu et al. |
| 2009/0087960 A1 | 4/2009 | Cho et al. |
| 2009/0087979 A1 | 4/2009 | Raghuram |
| 2009/0095621 A1 | 4/2009 | Kao et al. |
| 2009/0098706 A1 | 4/2009 | Kim et al. |
| 2009/0104738 A1 | 4/2009 | Ring et al. |
| 2009/0104782 A1 | 4/2009 | Lu et al. |
| 2009/0111280 A1 | 4/2009 | Kao et al. |
| 2009/0163041 A1 | 6/2009 | Mungekar et al. |
| 2009/0170221 A1 | 7/2009 | Jacques et al. |
| 2009/0170331 A1 | 7/2009 | Cheng et al. |
| 2009/0179300 A1 | 7/2009 | Arai |
| 2009/0189246 A1 | 7/2009 | Wu et al. |
| 2009/0194810 A1 | 8/2009 | Kiyotoshi et al. |
| 2009/0197418 A1 | 8/2009 | Sago |
| 2009/0202721 A1 | 8/2009 | Nogami et al. |
| 2009/0255902 A1 | 10/2009 | Satoh et al. |
| 2009/0258162 A1 | 10/2009 | Furuta et al. |
| 2009/0269934 A1 | 10/2009 | Kao et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277874 A1 | 11/2009 | Rui et al. |
| 2009/0280650 A1 | 11/2009 | Lubomirsky et al. |
| 2009/0286400 A1 | 11/2009 | Heo et al. |
| 2009/0294898 A1 | 12/2009 | Feustel et al. |
| 2010/0003824 A1 | 1/2010 | Kadkhodayan et al. |
| 2010/0022030 A1 | 1/2010 | Ditizio |
| 2010/0041207 A1 | 2/2010 | Lee et al. |
| 2010/0048027 A1 | 2/2010 | Cheng et al. |
| 2010/0055408 A1 | 3/2010 | Lee et al. |
| 2010/0055917 A1 | 3/2010 | Kim |
| 2010/0059889 A1 | 3/2010 | Gosset et al. |
| 2010/0062603 A1 | 3/2010 | Ganguly et al. |
| 2010/0075503 A1 | 3/2010 | Bencher |
| 2010/0093151 A1 | 4/2010 | Arghavani et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0130001 A1 | 5/2010 | Noguchi |
| 2010/0144140 A1 | 6/2010 | Chandrashekar et al. |
| 2010/0164422 A1 | 7/2010 | Shu et al. |
| 2010/0173499 A1 | 7/2010 | Tao et al. |
| 2010/0178755 A1 | 7/2010 | Lee et al. |
| 2010/0180819 A1 | 7/2010 | Hatanaka et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0197143 A1 | 8/2010 | Nishimura |
| 2010/0203739 A1 | 8/2010 | Becker et al. |
| 2010/0207205 A1 | 8/2010 | Grebs et al. |
| 2010/0240205 A1 | 9/2010 | Son |
| 2010/0294199 A1 | 11/2010 | Tran et al. |
| 2010/0330814 A1 | 12/2010 | Yokota et al. |
| 2011/0008950 A1 | 1/2011 | Xu |
| 2011/0011338 A1 | 1/2011 | Chuc et al. |
| 2011/0034035 A1 | 2/2011 | Liang et al. |
| 2011/0039407 A1 | 2/2011 | Nishizuka |
| 2011/0045676 A1 | 2/2011 | Park |
| 2011/0053380 A1 | 3/2011 | Sapre et al. |
| 2011/0061810 A1 | 3/2011 | Ganguly et al. |
| 2011/0081782 A1 | 4/2011 | Liang et al. |
| 2011/0100489 A1 | 5/2011 | Orito |
| 2011/0111596 A1 | 5/2011 | Kanakasabapathy |
| 2011/0114601 A1 | 5/2011 | Lubomirsky et al. |
| 2011/0115378 A1 | 5/2011 | Lubomirsky et al. |
| 2011/0124144 A1 | 5/2011 | Schlemm et al. |

(56) References Cited

U.S. PATENT DOCUMENTS

| | | |
|---|---|---|
| 2011/0143542 A1 | 6/2011 | Feurprier et al. |
| 2011/0151674 A1 | 6/2011 | Tang et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165771 A1 | 7/2011 | Ring et al. |
| 2011/0180847 A1 | 7/2011 | Ikeda et al. |
| 2011/0195575 A1 | 8/2011 | Wang |
| 2011/0217851 A1 | 9/2011 | Liang et al. |
| 2011/0226734 A1 | 9/2011 | Sumiya et al. |
| 2011/0227028 A1 | 9/2011 | Sekar et al. |
| 2011/0230052 A1 | 9/2011 | Tang et al. |
| 2011/0232737 A1 | 9/2011 | Ruletzki et al. |
| 2011/0266252 A1 | 11/2011 | Thadani et al. |
| 2011/0266682 A1 | 11/2011 | Edelstein et al. |
| 2011/0294300 A1 | 12/2011 | Zhang et al. |
| 2011/0298061 A1 | 12/2011 | Siddiqui et al. |
| 2012/0003782 A1 | 1/2012 | Byun et al. |
| 2012/0009796 A1 | 1/2012 | Cui et al. |
| 2012/0025289 A1 | 2/2012 | Liang et al. |
| 2012/0031559 A1 | 2/2012 | Dhindsa et al. |
| 2012/0052683 A1 | 3/2012 | Kim et al. |
| 2012/0068242 A1 | 3/2012 | Shin et al. |
| 2012/0074126 A1 | 3/2012 | Bang et al. |
| 2012/0085733 A1 | 4/2012 | Mebarki et al. |
| 2012/0103518 A1 | 5/2012 | Kakimoto |
| 2012/0104564 A1 | 5/2012 | Won et al. |
| 2012/0129354 A1 | 5/2012 | Luong |
| 2012/0135576 A1 | 5/2012 | Lee et al. |
| 2012/0161405 A1 | 6/2012 | Mohn et al. |
| 2012/0164839 A1 | 6/2012 | Nishimura |
| 2012/0180954 A1 | 7/2012 | Yang et al. |
| 2012/0181599 A1 | 7/2012 | Lung |
| 2012/0196447 A1 | 8/2012 | Yang et al. |
| 2012/0211462 A1 | 8/2012 | Zhang et al. |
| 2012/0223048 A1 | 9/2012 | Paranjpe et al. |
| 2012/0225557 A1 | 9/2012 | Serry et al. |
| 2012/0228642 A1 | 9/2012 | Aube et al. |
| 2012/0238102 A1 | 9/2012 | Zhang et al. |
| 2012/0238103 A1 | 9/2012 | Zhang et al. |
| 2012/0247670 A1 | 10/2012 | Dobashi et al. |
| 2012/0247671 A1 | 10/2012 | Sugawara |
| 2012/0267346 A1 | 10/2012 | Kao et al. |
| 2012/0285621 A1 | 11/2012 | Tan |
| 2012/0292664 A1 | 11/2012 | Kanike |
| 2012/0309204 A1 | 12/2012 | Kang et al. |
| 2013/0005103 A1 | 1/2013 | Liu et al. |
| 2013/0005140 A1 | 1/2013 | Jeng et al. |
| 2013/0034968 A1 | 2/2013 | Zhang et al. |
| 2013/0045605 A1 | 2/2013 | Wang et al. |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0065398 A1 | 3/2013 | Ohsawa et al. |
| 2013/0082197 A1 | 4/2013 | Yang et al. |
| 2013/0089988 A1 | 4/2013 | Wang et al. |
| 2013/0098868 A1 | 4/2013 | Nishimura et al. |
| 2013/0107415 A1 | 5/2013 | Banna et al. |
| 2013/0119016 A1 | 5/2013 | Kagoshima |
| 2013/0119457 A1 | 5/2013 | Lue et al. |
| 2013/0119483 A1 | 5/2013 | Alptekin et al. |
| 2013/0130506 A1 | 5/2013 | Wang et al. |
| 2013/0130507 A1 | 5/2013 | Wang et al. |
| 2013/0153148 A1 | 6/2013 | Yang et al. |
| 2013/0187220 A1 | 7/2013 | Surthi |
| 2013/0193108 A1 | 8/2013 | Zheng et al. |
| 2013/0217243 A1 | 8/2013 | Underwood et al. |
| 2013/0224960 A1 | 8/2013 | Payyapilly et al. |
| 2013/0260533 A1 | 10/2013 | Sapre et al. |
| 2013/0260564 A1 | 10/2013 | Sapre et al. |
| 2013/0284369 A1 | 10/2013 | Kobayashi et al. |
| 2013/0284370 A1 | 10/2013 | Kobayashi et al. |
| 2013/0298942 A1 | 11/2013 | Ren et al. |
| 2013/0302980 A1 | 11/2013 | Chandrashekar et al. |
| 2013/0337655 A1 | 12/2013 | Lee et al. |
| 2014/0004708 A1 | 1/2014 | Thedjoisworo |
| 2014/0021673 A1 | 1/2014 | Chen et al. |
| 2014/0057447 A1 | 2/2014 | Yang et al. |
| 2014/0065842 A1 | 3/2014 | Anthis et al. |
| 2014/0080308 A1 | 3/2014 | Chen et al. |
| 2014/0080309 A1 | 3/2014 | Park |
| 2014/0080310 A1 | 3/2014 | Chen et al. |
| 2014/0083362 A1 | 3/2014 | Lubomirsky et al. |
| 2014/0087488 A1 | 3/2014 | Nam et al. |
| 2014/0097270 A1 | 4/2014 | Liang et al. |
| 2014/0099794 A1 | 4/2014 | Ingle et al. |
| 2014/0134842 A1 | 5/2014 | Zhang et al. |
| 2014/0134847 A1 | 5/2014 | Seya |
| 2014/0141621 A1 | 5/2014 | Ren et al. |
| 2014/0154889 A1 | 6/2014 | Wang et al. |
| 2014/0166617 A1 | 6/2014 | Chen |
| 2014/0166618 A1 | 6/2014 | Tadigadapa et al. |
| 2014/0179111 A1 | 6/2014 | Liu et al. |
| 2014/0190410 A1 | 7/2014 | Kim |
| 2014/0199850 A1 | 7/2014 | Kim et al. |
| 2014/0199851 A1 | 7/2014 | Nemani et al. |
| 2014/0225504 A1 | 8/2014 | Kaneko et al. |
| 2014/0227881 A1 | 8/2014 | Lubomirsky et al. |
| 2014/0234466 A1 | 8/2014 | Gao et al. |
| 2014/0248780 A1 | 9/2014 | Ingle et al. |
| 2014/0252134 A1 | 9/2014 | Chen et al. |
| 2014/0256131 A1* | 9/2014 | Wang ............... H01L 21/32136 438/676 |
| 2014/0262031 A1 | 9/2014 | Belostotskiy et al. |
| 2014/0262038 A1 | 9/2014 | Wang et al. |
| 2014/0263173 A1 | 9/2014 | Rosslee et al. |
| 2014/0263272 A1 | 9/2014 | Duan et al. |
| 2014/0264533 A1 | 9/2014 | Simsek-Ege |
| 2014/0271097 A1 | 9/2014 | Wang et al. |
| 2014/0273373 A1 | 9/2014 | Makala et al. |
| 2014/0273406 A1 | 9/2014 | Wang et al. |
| 2014/0273451 A1 | 9/2014 | Wang et al. |
| 2014/0273462 A1 | 9/2014 | Simsek-Ege et al. |
| 2014/0273481 A1 | 9/2014 | Wang et al. |
| 2014/0273488 A1 | 9/2014 | Wang et al. |
| 2014/0273489 A1 | 9/2014 | Wang et al. |
| 2014/0273491 A1 | 9/2014 | Zhang et al. |
| 2014/0273492 A1 | 9/2014 | Anthis et al. |
| 2014/0273496 A1 | 9/2014 | Kao |
| 2014/0288528 A1 | 9/2014 | Py et al. |
| 2014/0302678 A1 | 10/2014 | Paterson et al. |
| 2014/0302680 A1 | 10/2014 | Singh |
| 2014/0308758 A1 | 10/2014 | Nemani et al. |
| 2014/0308816 A1 | 10/2014 | Wang et al. |
| 2014/0311581 A1 | 10/2014 | Belostotskiy et al. |
| 2014/0342532 A1 | 11/2014 | Zhu |
| 2014/0342569 A1 | 11/2014 | Zhu et al. |
| 2014/0349477 A1 | 11/2014 | Chandrashekar et al. |
| 2015/0011096 A1 | 1/2015 | Chandrasekharan et al. |
| 2015/0014152 A1 | 1/2015 | Hoinkis et al. |
| 2015/0031211 A1 | 1/2015 | Sapre et al. |
| 2015/0060265 A1 | 3/2015 | Cho et al. |
| 2015/0076110 A1 | 3/2015 | Wu et al. |
| 2015/0079797 A1 | 3/2015 | Chen et al. |
| 2015/0118858 A1 | 4/2015 | Takaba |
| 2015/0126035 A1 | 5/2015 | Diao et al. |
| 2015/0126039 A1 | 5/2015 | Korolik et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132953 A1 | 5/2015 | Nowling |
| 2015/0132968 A1 | 5/2015 | Ren et al. |
| 2015/0155177 A1 | 6/2015 | Zhang et al. |
| 2015/0170879 A1 | 6/2015 | Nguyen et al. |
| 2015/0170920 A1 | 6/2015 | Purayath et al. |
| 2015/0170924 A1 | 6/2015 | Nguyen et al. |
| 2015/0170935 A1 | 6/2015 | Wang et al. |
| 2015/0170943 A1 | 6/2015 | Nguyen et al. |
| 2015/0171008 A1 | 6/2015 | Luo |
| 2015/0179464 A1 | 6/2015 | Wang et al. |
| 2015/0206764 A1 | 7/2015 | Wang et al. |
| 2015/0214066 A1 | 7/2015 | Luere et al. |

(56) References Cited

U.S. PATENT DOCUMENTS

| | | |
|---|---|---|
| 2015/0214067 A1 | 7/2015 | Zhang et al. |
| 2015/0214092 A1 | 7/2015 | Purayath et al. |
| 2015/0214337 A1 | 7/2015 | Ko et al. |
| 2015/0221541 A1 | 8/2015 | Nemani et al. |
| 2015/0235863 A1 | 8/2015 | Chen |
| 2015/0235865 A1 | 8/2015 | Wang et al. |
| 2015/0235867 A1 | 8/2015 | Nishizuka |
| 2015/0247231 A1 | 9/2015 | Nguyen et al. |
| 2015/0249018 A1 | 9/2015 | Park et al. |
| 2015/0262829 A1 | 9/2015 | Park et al. |
| 2015/0270140 A1 | 9/2015 | Gupta et al. |
| 2015/0275361 A1 | 10/2015 | Lubomirsky et al. |
| 2015/0275375 A1 | 10/2015 | Kim et al. |
| 2015/0294980 A1 | 10/2015 | Lee et al. |
| 2015/0332930 A1 | 11/2015 | Wang et al. |
| 2015/0357201 A1 | 12/2015 | Chen et al. |
| 2015/0357205 A1 | 12/2015 | Wang et al. |
| 2015/0371861 A1 | 12/2015 | Li et al. |
| 2015/0371864 A1 | 12/2015 | Hsu et al. |
| 2015/0371865 A1 | 12/2015 | Chen et al. |
| 2015/0371866 A1 | 12/2015 | Chen et al. |
| 2016/0005572 A1 | 1/2016 | Liang et al. |
| 2016/0005833 A1 | 1/2016 | Collins et al. |
| 2016/0027654 A1 | 1/2016 | Kim et al. |
| 2016/0027673 A1 | 1/2016 | Wang et al. |
| 2016/0035586 A1 | 2/2016 | Purayath et al. |
| 2016/0035614 A1 | 2/2016 | Purayath et al. |

* cited by examiner

SILICON ETCH PROCESS WITH TUNABLE SELECTIVITY TO SiO₂ AND OTHER MATERIALS

CROSS-REFERENCE TO RELATED APPLICATIONS

This application is a non-provisional application of, and claims the benefit of priority to U.S. Provisional Patent Application No. 62/054,860, filed 24 Sep. 2014 and entitled "Silicon Etch Process With Tunable Selectivity to SiO₂ and Other Materials," which is incorporated herein by reference in its entirety for all purposes.

TECHNICAL FIELD

The present disclosure applies broadly to the field of plasma processing equipment. More specifically, systems and methods for managing selectivity of plasma etches are disclosed.

BACKGROUND

Semiconductor processing often utilizes plasma processing to etch, clean or deposit material on semiconductor wafers. Plasma etching often targets a particular material, but may also affect other materials that are present on the same wafer, or other workpiece. Selectivity of a plasma etch is often defined as a ratio of an etch rate of a target material to the etch rate of the same etch to another material. It is often advantageous for selectivity to be very high, such that the target material can be etched with little effect on other materials.

SUMMARY

In an embodiment, a tunable plasma etch process includes generating a plasma in a controlled flow of a source gas including $NH_3$ and $NF_3$ to form a stream of plasma products, controlling a flow of un-activated $NH_3$ that is added to the stream of plasma products to form an etch gas stream; and controlling pressure of the etch gas stream by adjusting at least one of the controlled flow of the source gas and the flow of un-activated $NH_3$ until the pressure is within a tolerance of a desired pressure. An etch rate of at least one of polysilicon and silicon dioxide by the etch gas stream is adjustable by varying a ratio of the controlled flow of the source gas to the flow of un-activated $NH_3$.

In an embodiment, a plasma etch processing system that etches silicon and silicon dioxide with tunable selectivity includes a first $NH_3$ flow controller, an $NF_3$ flow controller, and a remote plasma source configured to apply RF energy to a plasma source gas stream controlled by the first $NH_3$ flow controller and the $NF_3$ flow controller, to generate a plasma product stream from the plasma source gas stream. The processing system further includes a second $NH_3$ flow controller configured to control an un-activated $NH_3$ gas stream, apparatus for adding the un-activated $NH_3$ gas stream to the plasma product stream to form an etch gas stream, and a process chamber configured to expose a workpiece to the etch gas stream. Etch rates of at least one of polysilicon and silicon dioxide by the etch gas stream on the workpiece are adjustable at least by varying a ratio of the plasma source gas stream to the un-activated $NH_3$ gas stream.

In an embodiment, a plasma etch processing system includes a process chamber configured to expose a workpiece to an etch gas stream, and a plasma source that generates a plasma product stream from a source gas stream that includes $NH_3$ and $NF_3$. The system also includes means for controlling a first $NH_3$ flow and an $NF_3$ flow of the source gas stream, and means for controlling a second $NH_3$ flow of an un-activated $NH_3$ gas stream. The system also includes a diffuser plate disposed between the plasma source and the process chamber that allows the plasma product stream to flow through the diffuser plate toward the process chamber, and adds the un-activated $NH_3$ gas stream only on a process chamber side of the diffuser plate, to form an etch gas stream. The system also includes a controller for controlling the plasma source, the means for controlling the first $NH_3$ flow and the $NF_3$ flow of the source gas stream, and the means for controlling the second $NH_3$ flow of the un-activated $NH_3$ gas stream, such that the controller adjusts etch rates of at least one of polysilicon and silicon dioxide by the etch gas stream on the workpiece by varying a ratio of the un-activated $NH_3$ gas stream to the source gas stream.

DETAILED DESCRIPTION

Figure 1:
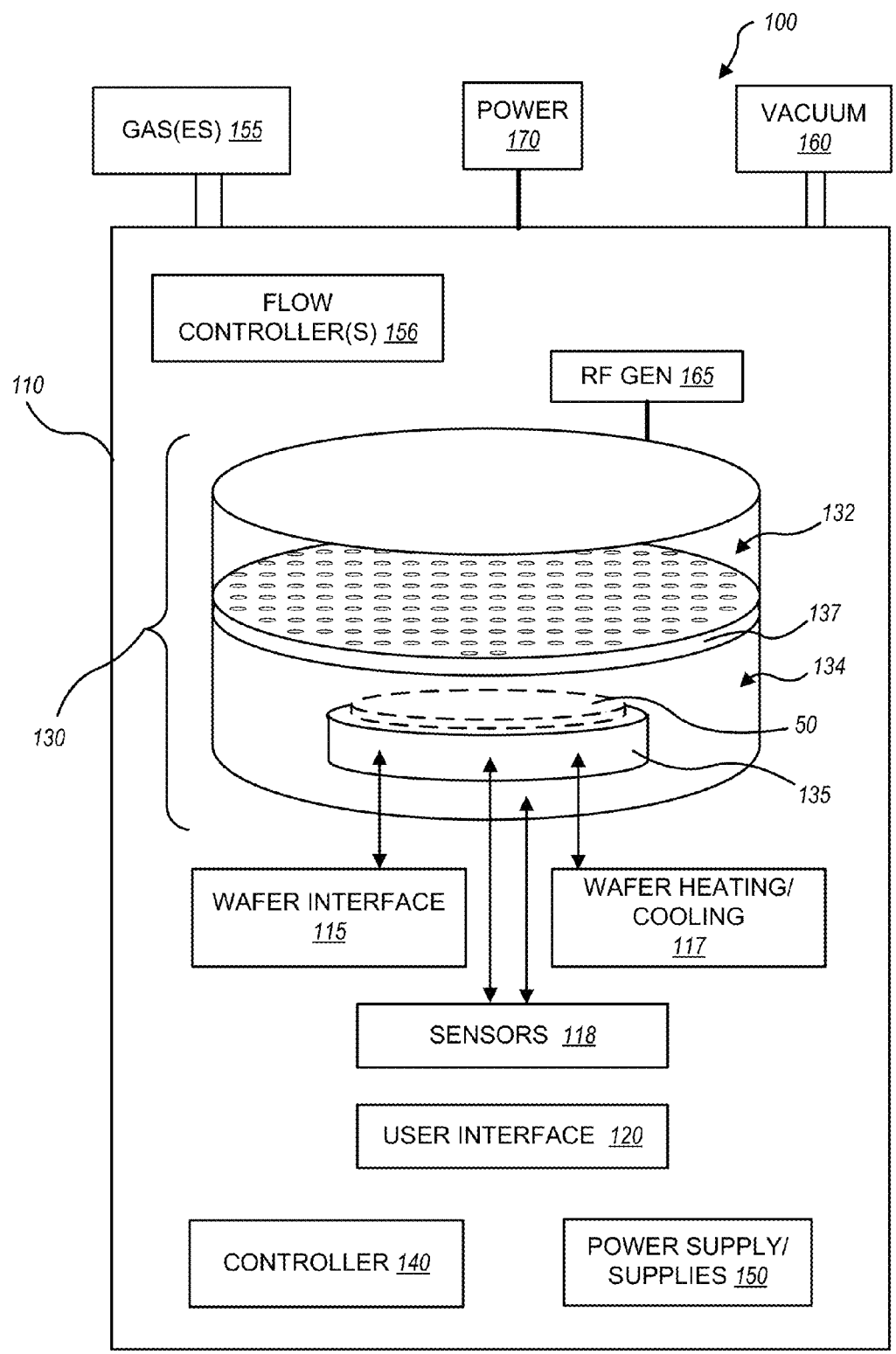
FIG. 1 schematically illustrates major elements of a plasma processing system, according to an embodiment.

FIG. 1 schematically illustrates major elements of a plasma processing system 100, according to an embodiment. System 100 is depicted as a single wafer, semiconductor wafer plasma processing system, but it will be apparent to one skilled in the art that the techniques and principles herein are applicable to plasma generation systems of any type (e.g., systems that do not necessarily process wafers or semiconductors). It should also be understood that FIG. 1 is a simplified diagram illustrating only selected, major elements of system 100; an actual processing system will accordingly look different and likely contain additional elements as compared with system 100.

Processing system 100 includes a housing 110 for at least a wafer interface 115, a user interface 120, a plasma processing unit 130, a controller 140, one or more flow controller(s) 156 and one or more power supplies 150. Processing system 100 is supported by various utilities that may include gas(es) 155, electrical power 170, vacuum 160 and optionally others;

within system 100, controller 140 may control use of any or all of such utilities. Internal plumbing and electrical connections within processing system 100 are not shown, for clarity of illustration.

Processing system 100 is illustrated as a so-called indirect, or remote, plasma processing system that generates a plasma in a first location and directs the plasma and/or plasma products (e.g., ions, molecular fragments, free radicals, energized species and the like) to a second location where processing occurs. Thus, in FIG. 1, plasma processing unit 130 includes a remote plasma source 132 that supplies plasma and/or plasma products for a process chamber 134. Process chamber 134 includes one or more wafer pedestals 135, to which wafer interface 115 delivers and retrieves workpieces 50 (e.g., a semiconductor wafer, but could be a different type of workpiece) for processing. Wafer pedestal 135 is heated and/or cooled by a wafer heating/cooling apparatus 117 which could include, in embodiments, resistive heaters, other types of heaters, or cooling fluids. In operation, gas(es) 155 are introduced into plasma source 132 and a radio frequency generator (RF Gen) 165 supplies power to ignite a plasma within plasma source 132. Plasma and/or plasma products pass from plasma source 132 through at least a diffuser plate 137 to process chamber 134, where workpiece 50 is processed. An actual plasma system may provide many other optional features or subsystems through which plasma and/or plasma products flow and/or mix between plasma source 132 and process chamber 134, and may include sensors 118 that measure parameters such as pressures, temperatures, optical emissions and the like at wafer pedestal 135, within process chamber 134 as shown, and possibly at other locations within processing system 100.

The elements illustrated as part of system 100 are listed by way of example and are not exhaustive. Many other possible elements, such as: pressure and/or flow controllers; gas or plasma manifolds or distribution apparatus; ion suppression plates; electrodes, magnetic cores and/or other electromagnetic apparatus; mechanical, pressure, temperature, chemical, optical and/or electronic sensors; wafer or other workpiece handling mechanisms; viewing and/or other access ports; and the like may also be included, but are not shown for clarity of illustration. In particular, flow controllers may be, or include, mass flow controllers, valves, needle valves, and pressure regulators. Various control schemes affecting conditions in process chamber 105 are possible. For example, a pressure may be maintained by monitoring the pressure in process chamber 134 and adjusting all gas flows upwards or downwards until the measured pressure is within some tolerance of a desired pressure. In embodiments herein, the pressure may be controllable within a range of about 0.5 Torr to 10 Torr; in certain embodiments, controlling pressure around 2 Torr or 6 Torr may be advantageous. Temperatures can be controlled by adding heaters and temperature sensors to process chamber 134 and/or wafer pedestal 135. Optical sensors may detect emission peaks of plasmas as-generated and/or as they interact with workpieces.

Internal connections and cooperation of the elements illustrated within system 100 are also not shown for clarity of illustration. In addition to RF generator 165 and gases 155, other representative utilities such as vacuum 160 and/or general purpose electrical power 170 may connect with system 100. Like the elements illustrated in system 100, the utilities illustrated as connected with system 100 are intended as illustrative rather than exhaustive; other types of utilities such as heating or cooling fluids, pressurized air, network capabilities, waste disposal systems and the like may also be connected with system 100, but are not shown for clarity of illustration. Similarly, while the above description mentions that plasma is ignited within remote plasma source 132, the principles discussed below are equally applicable to so-called "direct" plasma systems that create a plasma in a the actual location of workpiece processing.

Although an indirect plasma processing system is illustrated in FIG. 1 and elsewhere in this disclosure, it should be clear to one skilled in the art that the techniques, apparatus and methods disclosed herein may also be applicable to direct plasma processing systems—e.g., where a plasma is ignited at the location of the workpiece(s). Similarly, in embodiments, the components of processing system 100 may be reorganized, redistributed and/or duplicated, for example: (1) to provide a single processing system with multiple process chambers; (2) to provide multiple remote plasma sources for a single process chamber; (3) to provide multiple workpiece fixtures (e.g., wafer pedestals 135) within a single process chamber; (4) to utilize a single remote plasma source to supply plasma products to multiple process chambers; and/or (5) to provide plasma and gas sources in serial/parallel combinations such that various source gases may be activated (e.g., exist at least temporarily as part of a plasma) zero, one, two or more times, and mixed with other source gases before or after they enter a process chamber, and the like. Gases that have not been part of a plasma are sometimes referred to as "un-activated" gases herein.

Figure 2:
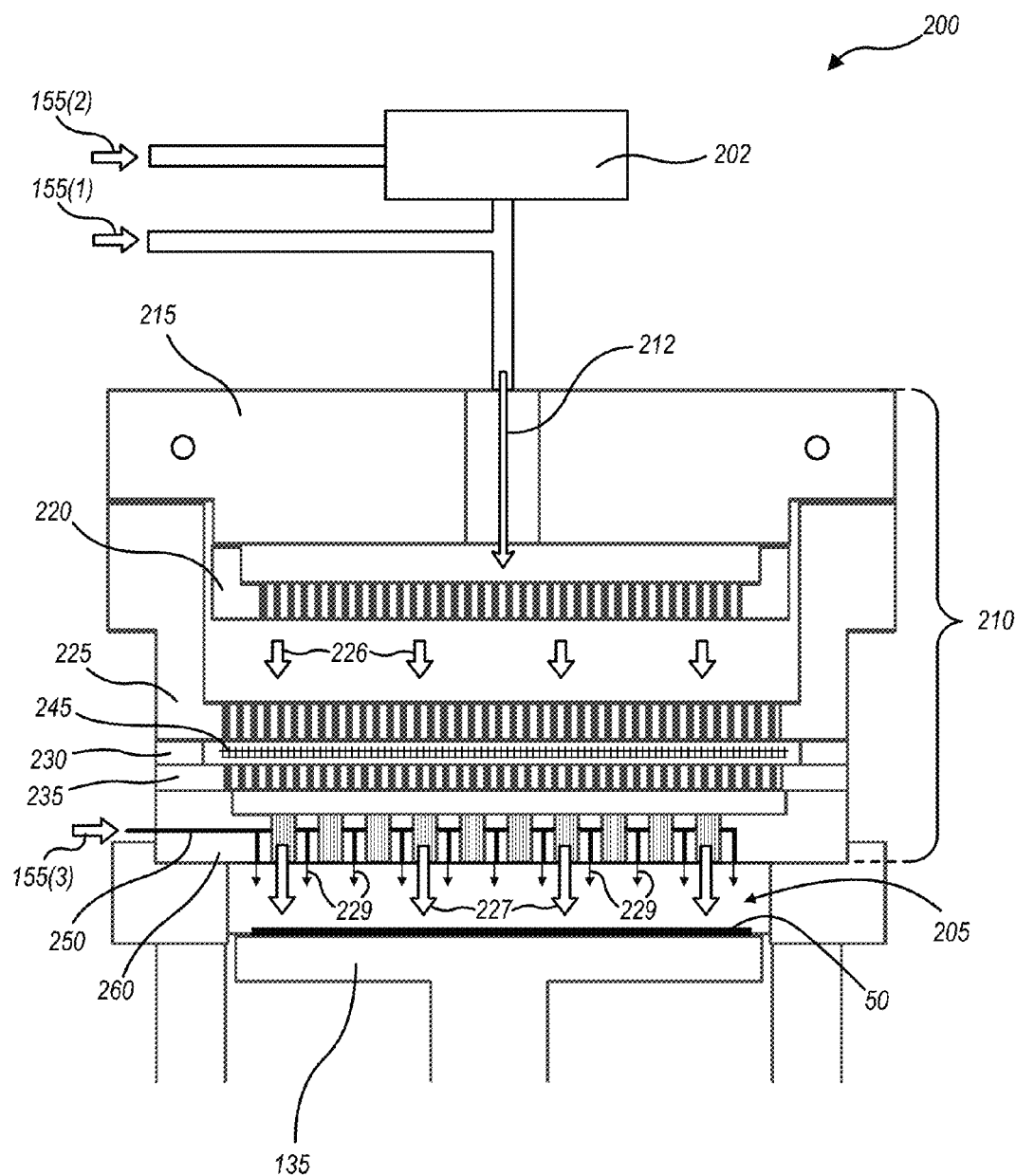
FIG. 2 schematically illustrates major elements of a plasma processing system, in a cross-sectional view, according to an embodiment.

FIG. 2 schematically illustrates major elements of a plasma processing system 200, in a cross-sectional view, according to an embodiment. Plasma processing system 200 is an example of plasma processing unit 130, FIG. 1. Plasma processing system 200 includes a process chamber 205 and a plasma source 210. As illustrated in FIG. 2, plasma source 210 introduces gases 155(1) directly, and/or gases 155(2) that become plasma products in a further remote plasma source 202, as plasma input gas 212, through an RF electrode 215. RF electrode 215 includes (e.g., is electrically tied to) a first gas diffuser 220 and a face plate 225 that serve to redirect flow of the source gases so that gas flow is uniform across plasma source 210, as indicated by small arrows 226. After flowing through face plate 225, an insulator 230 electrically insulates RF electrode 215 from a diffuser 235 that is held at electrical ground (e.g., diffuser 235 serves as a second electrode counterfacing face plate 225 of RF electrode 215). Surfaces of RF electrode 215, diffuser 235 and insulator 230 define a plasma generation cavity where a capacitively coupled plasma 245 is created when the source gases are present and RF energy is provided through RF electrode 215. RF electrode 215 and diffuser 235 may be formed of any conductor, and in embodiments are formed of aluminum (or an aluminum alloy, such as the known "6061" alloy type). Surfaces of face plate 225 and diffuser 235 that face the plasma cavity or are otherwise exposed to reactive gases may be coated with yttria ($Y_2O_3$) or alumina ($Al_2O_3$) for resistance to the reactive gases and plasma products generated in the plasma cavity. Insulator 230 may be any insulator, and in embodiments is formed of ceramic.

Plasma products generated in plasma 245 pass through diffuser 235 that again helps to promote the uniform distribution of plasma products, and may assist in electron temperature control. Upon passing through diffuser 235, the plasma products pass through a further diffuser 260 that promotes uniformity as indicated by small arrows 227, and enter process chamber 205 where they interact with workpiece 50, such as a semiconductor wafer, atop wafer pedestal 135. Diffuser 260 includes further gas channels 250 that may be used to add one or more additional, un-activated gases 155(3) to the plasma products as they enter process chamber 205, as indicated by very small arrows 229. Diffuser 260 provides un-activated gases 155(3) only on a downstream, or process chamber side, as shown.

Embodiments herein may be rearranged and may form a variety of shapes. For example, RF electrode 215 and diffuser 235 are substantially radially symmetric in the embodiment illustrated in FIG. 2, and insulator 230 is a ring disposed against peripheral areas of face plate 225 and diffuser 235, for an application that processes a circular semiconductor wafer as workpiece 50. However, such features may be of any shape that is consistent with use as a plasma source. Moreover, the exact number and placement of features for introducing and distributing gases and/or plasma products, such as diffusers, face plates and the like, may also vary. For example, it would be possible to substitute an arrangement for generating an inductively coupled plasma, for the capacitively coupled plasma arrangement illustrated. Also, in a similar manner to diffuser 260 including gas channels 250 to add un-activated gas 155(3) to plasma products from plasma 245 as they enter process chamber 205, other components of plasma processing system 200 may be configured to add or mix gases 155 with other gases and/or plasma products as they make their way through the system to process chamber 205.

In semiconductor processing, plasma etch processes for etching polycrystalline silicon (hereinafter sometimes referred to as "polysilicon" or "poly") are often advantageously selective to silicon over silicon dioxide (hereinafter sometimes referred to as "oxide"). One process scenario in which a plasma etch is highly selective to poly over oxide is as follows. Polysilicon is often utilized as a "gate" electrode in so-called "MOS" transistors (MOS standing for Metal-Oxide-Semiconductor, although poly, instead of metal, is usually used for the gate electrode material). To form planar MOS transistors, a "source" and "drain" are formed in a silicon wafer, with the gate defining separation of, and influencing electrical conduction between, the source and drain. A poly layer may be deposited over a dielectric layer, typically $SiO_2$. The $SiO_2$ layer is typically very thin, to maximize field strength in this layer in the final transistor when a voltage is applied. The poly layer is typically thicker than the $SiO_2$ layer, and poly depositions are often conformal such that minor crevices on the wafer surface fill with poly. When the poly layer is patterned, the poly in these crevices must be removed to prevent adjacent transistor gates from shorting to one another. The $SiO_2$ layer may need to protect other parts of the wafer during the fabrication process, especially as portions of the poly layer are etched away to form the transistor gates. Therefore, a poly etch with low selectivity to oxide (e.g., a poly etch that etches oxide, as well) might etch through the $SiO_2$ layer and damage the underlying silicon wafer areas that are intended to form the source and drain of the transistor.

There are, however, device geometries and processes that benefit from a less selective poly etch. For example, recent technologies have moved away from the original, planar MOS process in which gates always overlie thin dielectric layers on a generally flat silicon wafer surface, and/or form capacitors with conductors across a thin dielectric layer. Certain processes etch trenches into silicon surfaces, then grow or deposit oxides on the trench surfaces to form trench devices, including trench capacitors having much larger capacitance per unit area than would be possible on the flat wafer surface. These and/or other processes generate silicon fins by, for example, generating vertical steps on a wafer, depositing poly conformally, and anisotropically etching back the poly in a vertical direction, clearing the poly from horizontal surfaces but leaving the fins behind as residual features against the vertical steps. Many other arrangements are in use or under study to reduce wafer area needed for fabrication of complex devices, to improve device performance, density and/or yield of working circuits per wafer. In such cases, a plasma etch having a selectivity that could be adjustable, or "tunable" from highly selective to poly over oxide, to less selective, or even to being selective to oxide over poly, is advantageous.

Plasma etch embodiments herein have tunable selectivity, for example selectivity to Si over oxide. These embodiments typically utilize $NF_3$ and $NH_3$ gases as plasma source gases, and/or as gases that are mixed with plasma products before reaching the workpiece. Certain other gases such as He or Ar may additionally be used as carrier gases but generally do not take part in reactions; also, small percentages (less than about 10% of total gas flow) of oxygen may be added to help with plasma ignition and to boost reaction rates in the plasma. Generally speaking, in the plasma environment $NF_3$ and $NH_3$ dissociate, and/or some of the generated products thereof can combine, to form plasma products such as free H and F radicals, HF, $N_2$, $NH_4F$ and/or $NH_4F.HF$. Of these plasma products, plasma activation favors formation of free H and F radicals, HF and $N_2$, while addition of un-activated $NH_3$ favors formation of $NH_4F$ and/or $NH_4F.HF$. When Si (e.g., polysilicon) is present, F and Si can react to form $SiF_4$, while H and Si can react to form $SiH_4$. When $SiO_2$ is present, $NH_4F$ or $NH_4F.HF$ can react with $SiO_2$ to form $(NH_4)_2SiF_6$ and $H_2O$; importantly, $(NH_4)_2SiF_6$ generally forms and remains as a solid, but heat can cause it to dissociate to form $SiF_4$, $NH_3$ and HF. Also when $SiO_2$ is present, $NH_4F$ and $NH_4F.HF$ can react with $SiO_2$ to form $SiH_4F$, $H_2O$ and $NH_3$. Certain of these source gases may participate in reactions even when provided in un-activated form, for example, when provided as un-activated gas flow 155(3), in addition to plasma products from plasma 245, FIG. 2.

Etches described herein are also tunable with respect to selectivity of poly over silicon nitride. (The classic formulation of silicon nitride is $Si_3N_4$, but stoichiometry of silicon nitride can vary depending on the conditions in which it is generated. In this disclosure, $Si_3N_4$ and other stoichiometric variations of silicon nitride are referred to herein simply as SiN.) When SiN is present, $NF_3$ and SiN can react to form NF and $SiF_4$, while $NF_3$, $NH_3$ and SiN can react to form $SiH_4.HF$ and $NH_4F.HF$.

It has been discovered that in embodiments, certain ones of the input gases (e.g., $NF_3$ and $NH_3$) have different effects on the etching, as does the proportion of input gases that are activated by forming plasma therefrom, to un-activated gases (e.g., the proportion of input gas 212 to gas 155(3), see FIG. 2), so as to provide etches with tunable selectivity. Temperature and pressure have also been discovered to have effects. These effects can be utilized to tune an etch that fundamentally uses the same types of input gases to have different selectivities, as discussed below. As noted above, it is possible to adjust ratios of plasma products to un-activated gas (e.g., by adjusting ratios of input gas 212, which forms plasma 245, to gas 155(3), see FIG. 2) to further vary these effects. Furthermore, in embodiments, the etches disclosed can be performed in such a way as to maintain very high selectivity to other materials that may be present on a wafer and should be left undisturbed, such as TiN or W. Still furthermore, the etches disclosed can, in embodiments, have differing etch rates such that an etch recipe can be tuned for high etch rate during one part of an etch sequence, and a different etch rate during another part of the etch sequence.

In an embodiment, a first variation of a plasma etch process (or "recipe") has an initial ratio of $NH_3$ to $NF_3$ as a plasma source gas (e.g., input gas 212) that forms plasma products in plasma 245, and adds further $NH_3$ as an un-activated gas (e.g., gas 155(3)) resulting in a ratio of input gas 212 to gas 155(3) of about 10:1. The first recipe is performed at a pressure of 2 Torr at the wafer (e.g., workpiece 50 in process chamber 205). The pressure of 2 Torr may be maintained, for example, by monitoring the pressure in process chamber 205 and adjusting all gas flows upwards or downwards until the measured pressure is within some tolerance of 2 Torr. The first recipe has a poly over oxide selectivity of about 20:1. In the first recipe, the dominant plasma reactions include $NF_3$ and $NH_3$ providing substantial amounts of free F and H radicals, which react aggressively with Si but less aggressively with $SiO_2$.

A second variation of the etch recipe flows the same ratio of $NH_3$ to $NF_3$ as input gas 212, but at a lower volume, and/or adds more $NH_3$ as un-activated gas 155(3), as compared to the first recipe. The gas flows of the second etch recipe result in a ratio of input gas 212 to gas 155(3) of about 4:1 or 5:1. The second etch recipe is also performed at a pressure of 2 Torr. The resulting poly over oxide etch rate selectivity is about 2:1. The reduced etch rate selectivity is due to the adjusted gas flows favoring production of $NH_4F$ and $NH_4F \cdot HF$, which substantially etch $SiO_2$, over production of F and H radicals, which preferentially etch Si.

A third variation of the etch recipe flows the same ratio of $NH_3$ to $NF_3$ as input gas 212, and $NH_3$ as un-activated gas 155(3), as compared to the second recipe, but is performed at a pressure of 6 Torr. The increased pressure reduces the mean free path of available F and H radicals, which again favors the etching of $SiO_2$ over the etching of Si. The third etch recipe actually etches oxide faster than poly, with a resulting etch rate selectivity of oxide over poly of about 3:1.

The etch recipes noted above may proceed faster at relatively high wafer temperatures, such as greater than 100 C. The etch recipes noted above can also be highly selective to materials such as TiN and W that are commonly utilized in semiconductor processing at the so-called "frontend" of the process (e.g., layers where transistors and gates are formed and interconnected). That is, the etch rates of TiN and W can be negligibly low. Achieving high selectivity to TiN requires that temperature of a wafer being etched be maintained at less than about 125 C, at which temperature fluorine radicals begin to attack TiN.

Because the etches described above continuously vary the ratio of $NH_3$ and $NF_3$ plasma products (e.g., free F and H radicals) to un-activated $NH_3$ that is added, and the pressure at the workpiece (e.g., in process chamber 205), it is believed that the selectivity of poly to oxide etch rates can be continuously adjusted at least between the extremes noted above; that is, at least from 20:1 poly over oxide to 3:1 oxide over poly. This generates new possibilities for etch recipes, for example, the ability to tailor a plasma etch to provide a selectivity that accommodates process requirements for certain device geometries, or to change the etch selectivity to accommodate changes in device geometry. It may also simplify the deployment of plasma equipment for multiple, similar etch steps in semiconductor process flows, since the input chemistry utilizes the same gases in different ratios to produce different results. Because the types of input gases do not change, process aspects such as conditioning of chamber surfaces is expected not to change significantly, such that a single piece of processing equipment could be shifted rapidly from one process to another with little or no re-conditioning of the surfaces.

Figure 3:
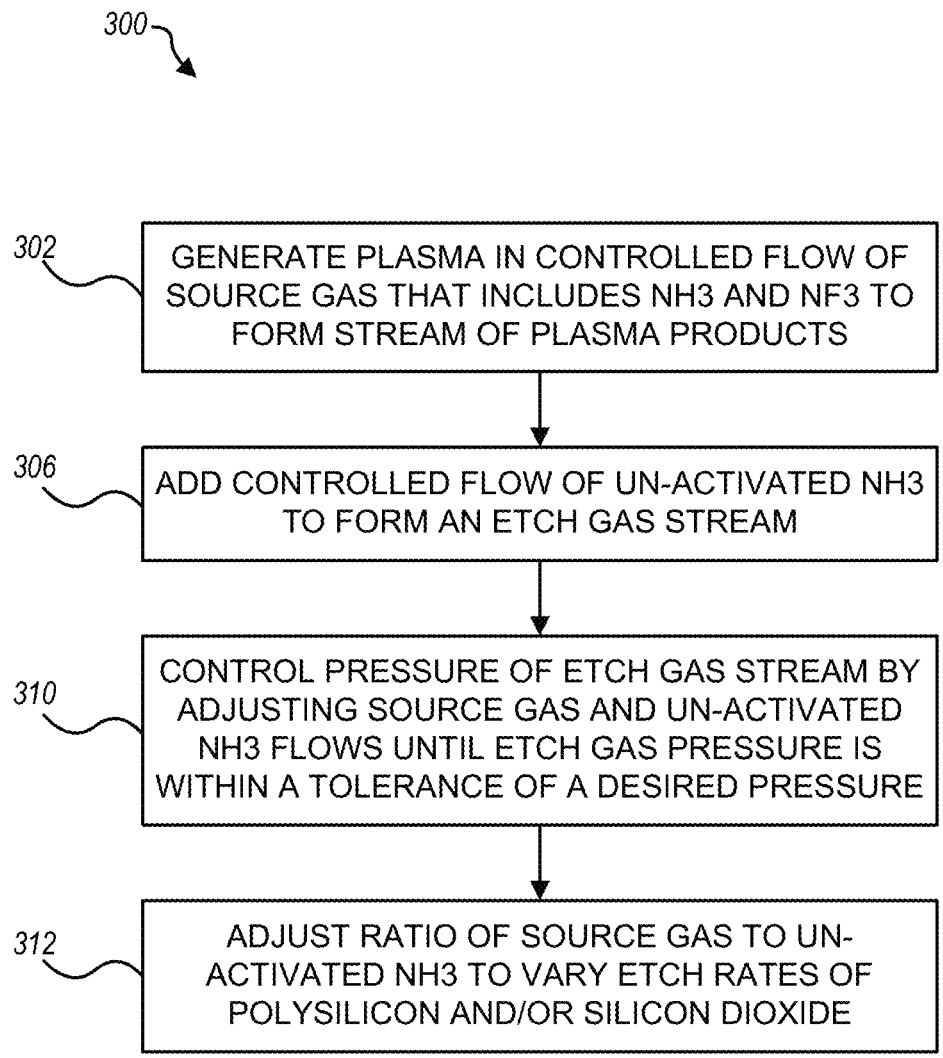
FIG. 3 is a flowchart of a tunable plasma etch process, according to an embodiment.

FIG. 3 is a flowchart of a tunable plasma etch process 300. Plasma etch process 300 may be implemented, for example, by plasma processing system 100, FIG. 1, and/or other plasma processing systems that utilize plasma processing system 200, FIG. 2. In step 302, a plasma is generated in a controlled flow of a source gas that includes $NH_3$ and $NF_3$. An example of step 302 is flowing a mixture of $NH_3$ and $NF_3$ as input gas 212, FIG. 2, and generating plasma 245 therefrom. Plasma 245 will include plasma products such as H and F free radicals, HF and N2, as shown in reaction (1) above. In step 306, a controlled flow of un-activated $NH_3$ is added to the stream of plasma products, to form an etch gas stream. An example of step 306 is flowing $NH_3$ as un-activated gas 155(3), FIG. 2. Step 310 controls pressure of the etch gas stream by adjusting the source gas and un-activated $NH_3$ flows until the etch gas pressure is within a tolerance of a desired pressure. An example of step 310 is controlling pressure of the etch gas stream in process chamber 205, FIG. 2, and adjusting flows of input gas 212 and un-activated gas 155(3) until the pressure in process chamber 205 is within a tolerance of the desired pressure. Step 312 adjusts a ratio of source gas to un-activated $NH_3$ to vary etch rates of polysilicon and/or silicon dioxide to achieve the desired selectivity. Step 312 is done in concert with step 310; that is, an adjustment to one of the source gas and un-activated $NH_3$ will typically be performed with an adjustment to the other, so that the etch gas pressure and flow ratio are maintained simultaneously.

Figure 4:
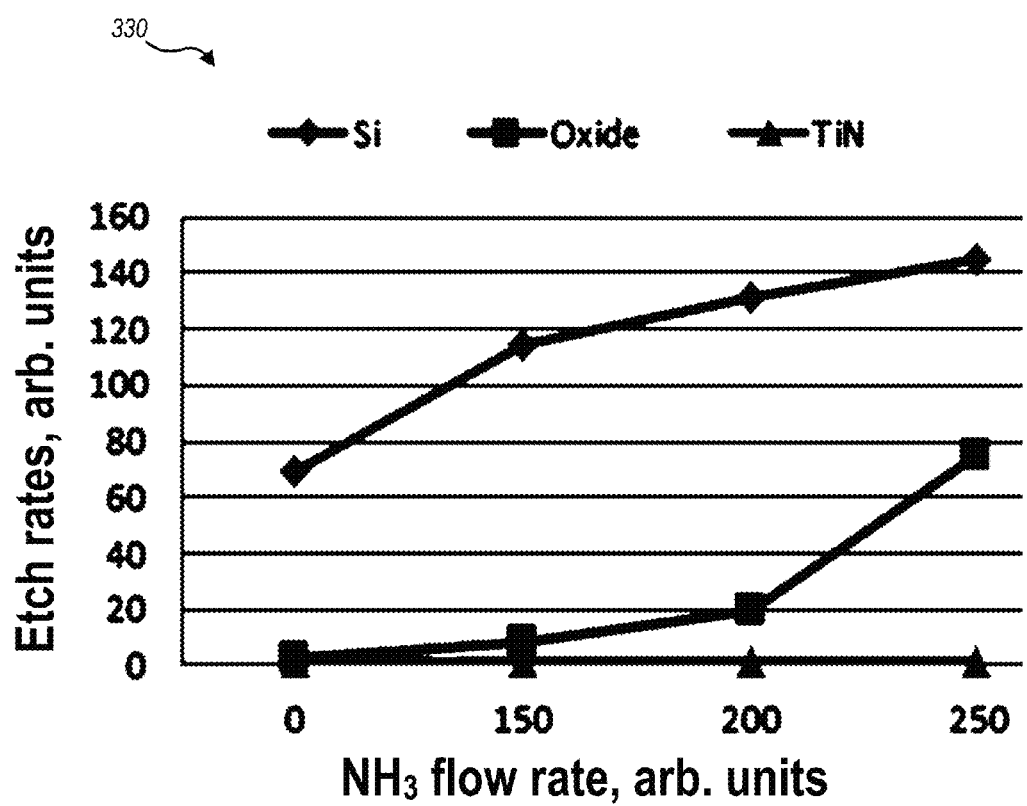
FIG. 4 shows a graph that illustrates test etch rate results of a Si etch having tunable selectivity to $SiO_2$, according to an embodiment.

FIG. 4 shows a graph 330 that illustrates test etch rate results of a Si etch having tunable selectivity to $SiO_2$. In the etch illustrated, $NF_3$ and $NH_3$ may be supplied either as source gases 155(2) in the apparatus illustrated in FIG. 2, and activated in remote plasma source 202, or may be supplied as source gases 155(1) and activated in plasma 245. In the test data illustrated, TiN etch rate was measured but remained at zero across all tested process conditions. When the un-activated $NH_3$ flow rate was zero, Si had a low etch rate while $SiO_2$ (labeled as "Oxide" in graph 330) had an etch rate of almost zero. Therefore with an un-activated $NH_3$ flow rate of zero, the etch conditions were extremely selective to Si over oxide. As the un-activated $NH_3$ flow rate increased, both Si and oxide etch rates increased, therefore the corresponding etch conditions were less selective to Si over oxide. At the highest un-activated $NH_3$ flow rate tested, the oxide etch rate increased enough that the Si over oxide selectivity was only about 2:1.

Figure 5:
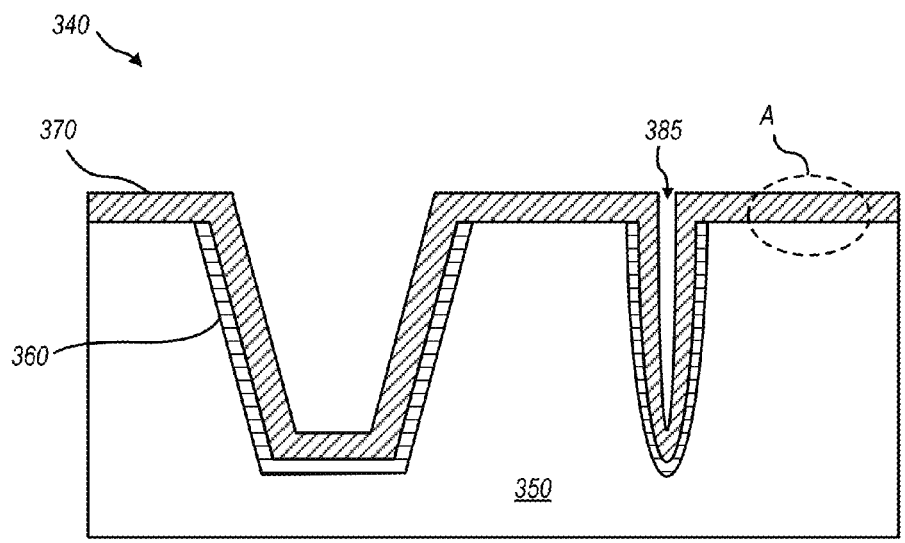
FIG. 5 illustrates an $SiO_2$ region on a wafer section, forming trenches that are lined with TiN, according to an embodiment.
Figure 6:
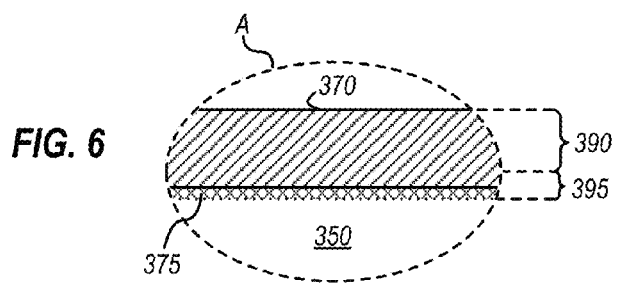
FIG. 6 illustrates the $SiO_2$ region of FIG. 5 as including a significant fraction of Si, according to an embodiment.
Figure 7:
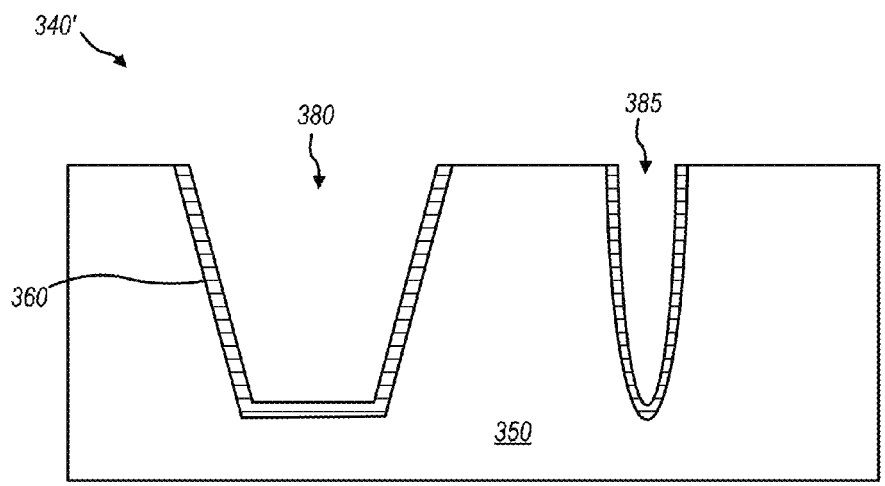
FIG. 7 illustrates the result of etching the wafer section of FIG. 5 with a Si etch having tunable selectivity to $SiO_2$ to form a modified wafer section, according to an embodiment.

FIGS. 5, 6 and 7 illustrate a process application that advantageously utilizes a Si etch with tunable selectivity to oxide, as described herein.

FIG. 5 illustrates an $SiO_2$ region 350 on a wafer section 340, forming trenches 380, 385 that are lined with TiN 360. Atop TiN layer 360 is a poly layer 370. A region labeled as A in FIG. 5 is illustrated in greater detail in FIG. 6.

FIG. 6 illustrates that poly layer 370 sits atop a region of $SiO_2$ 375 that includes a significant fraction of Si. It is important in this process that $SiO_2$ 375 not be etched significantly, so when $SiO_2$ 375 is exposed, an etch that is highly selective to poly over oxide should be employed, to minimize attack on $SiO_2$ 375. Thus, the following discussion begins with generating a plasma in a controlled flow of source gas that includes $NH_3$ and $NF_3$, to form a stream of plasma products, and adding a controlled flow of un-activated $NH_3$ to form an etch gas stream that interacts with poly layer 370 and $SiO_2$ 375. Referring to FIG. 4, this suggests processing with an un-activated $NH_3$ flow rate of zero, or nearly zero, to maximize selectivity of the etch to poly over oxide. However, low flows of $NH_3$ are also associated with somewhat lower Si etch rate, which will make the etch process take longer if the low or zero flow rate of un-activated $NH_3$ is used continually. A compromise that provides high etch throughput and high selectivity when $SiO_2$ 375 is exposed, is provided by utilizing the etch with tunable selectivity as described herein. Since the poly etch rate is at least approximately known from graph 330, and the thickness of poly layer 370 is known, the etch can start out with a relatively high un-activated NH₃ flow rate. For example, a flow rate of 150 to 250, in the arbitrary units illustrated in FIG. 4, can be used. This provides a high poly etch rate, and this etch rate is maintained for a time calculated as corresponding to etching partially, but not completely, through the region of poly 370 labeled as 390 in FIG. 6. Then, either in a separate etch step or without interrupting the etch, the un-activated NH₃ flow rate is brought down to zero, or near zero, while etching the region of poly 370 labeled as 395. This causes the poly etch rate to drop, but the corresponding oxide etch rate also drops to near zero, as illustrated in FIG. 4, so the etch can completely clear poly 370 without significant attack on Si rich SiO₂ 375. All of the process conditions are also highly selective to TiN such that a reasonable overetch can be used to clear poly in topologically difficult locations such as sidewalls of trenches 380 and 385 while leaving TiN 360 intact. FIG. 7 illustrates the result of etching wafer section 340 to form wafer section 340'.

Figure 8A:
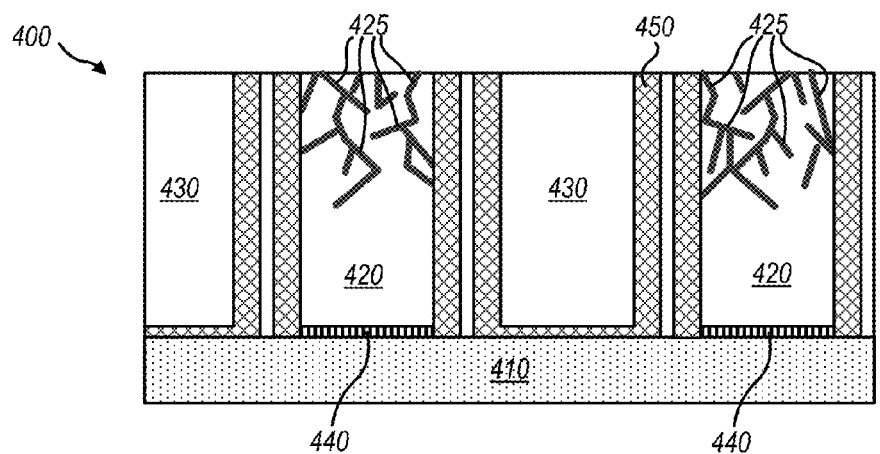
FIGS. 8A, 8B and 8C schematically illustrate a process sequence in which trace amounts of $SiO_2$ are not successfully removed by prior art processing.
Figure 8B:
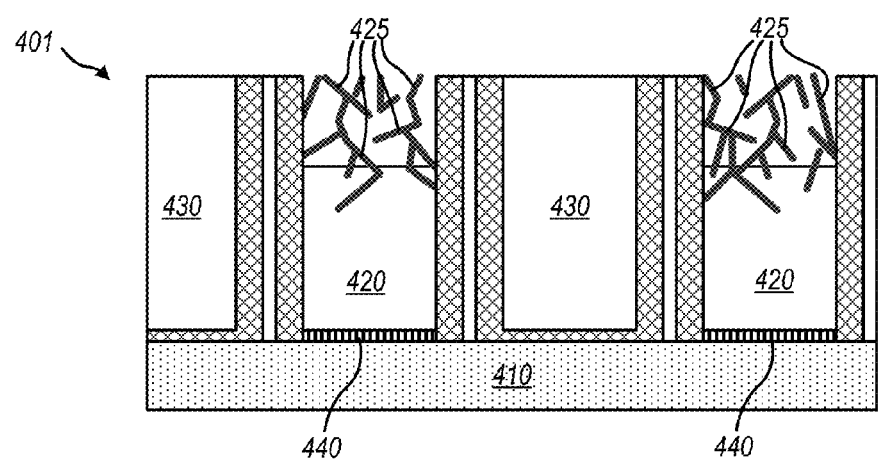
Figure 8C:
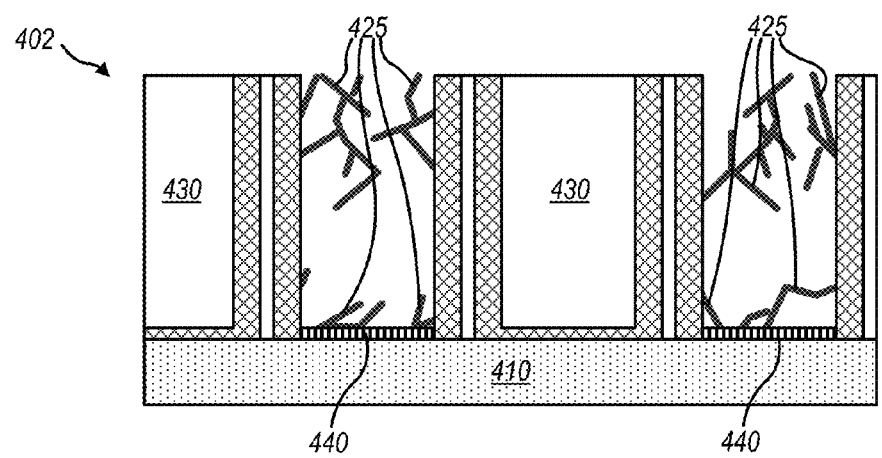

FIGS. 8A, 8B and 8C schematically illustrate a process sequence in which trace amounts of SiO₂ are not successfully removed by prior art processing. FIG. 8A shows a wafer section 400 that includes a portion of a silicon substrate 410 and overlying structures. A spacer structure 450 is part of a fin-FET process. Certain recesses within spacer structure 450 contain inter-layer dielectric oxides 430 that are generally to be retained in the etch sequence to be described. Other recesses contain polysilicon 420 that is to be removed; however the polysilicon is partially oxidized along grain boundaries thereof, shown as oxide traces 425, near the surface. Depth of oxide traces 425 is known with reasonable accuracy. Below the poly, adjacent to silicon substrate 410 in the same recesses of spacer structure 450 are thin layers of high dielectric constant oxide ("high-K oxide" hereinafter) 440 that are not to be etched at all.

FIG. 8B schematically illustrates partial etching of wafer section 400 with a highly selective poly etch to form a partially processed wafer section 401. The poly etch used is highly selective so as not to etch high-K oxide 440, but because of this selectivity, oxide traces 425 are also not etched. Wafer section 401 shows how wafer section 401 will look as poly 420 is about one third etched away.

FIG. 8C schematically illustrates further etching of wafer section 400 with a highly selective poly etch to form a partially processed wafer section 402. Some oxide traces 425 remain in their original locations, while others, having lost all mechanical connection with spacer structure 450, migrate about the recesses to other locations, as shown. At least some of oxide traces 425 cause electrical defects in the finished semiconductor product, as they interfere with the structures that should be present at their locations, and/or cause photolithographic defects in further processing.

Figure 9A:
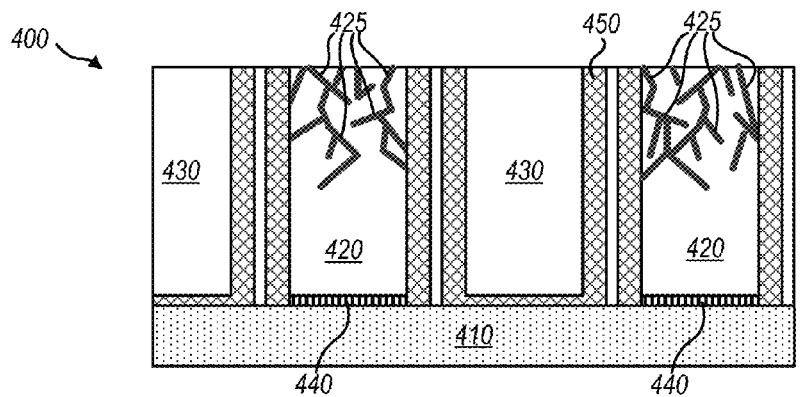
FIGS. 9A, 9B, 9C and 9D schematically show how the structure shown in FIGS. 8A, 8B and 8C can be more successfully processed with a Si etch with tunable selectivity to oxide, according to embodiments herein.
Figure 9B:
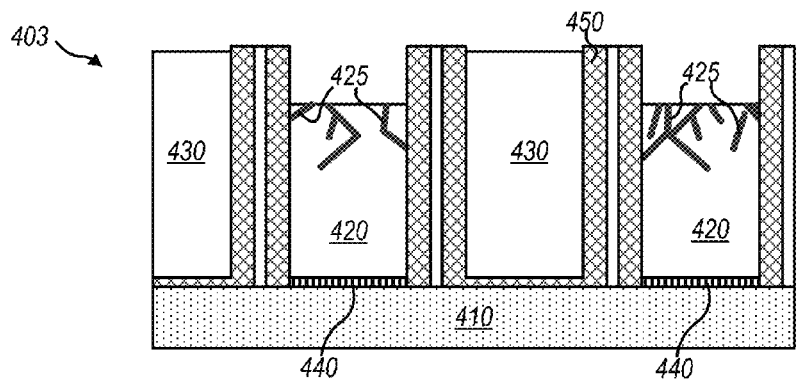
Figure 9C:
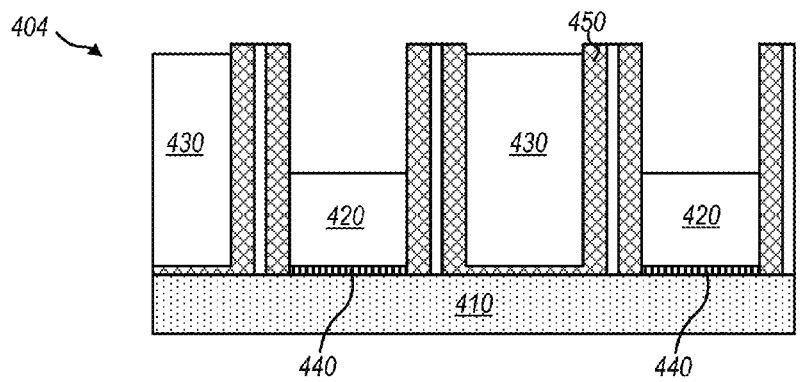
Figure 9D:
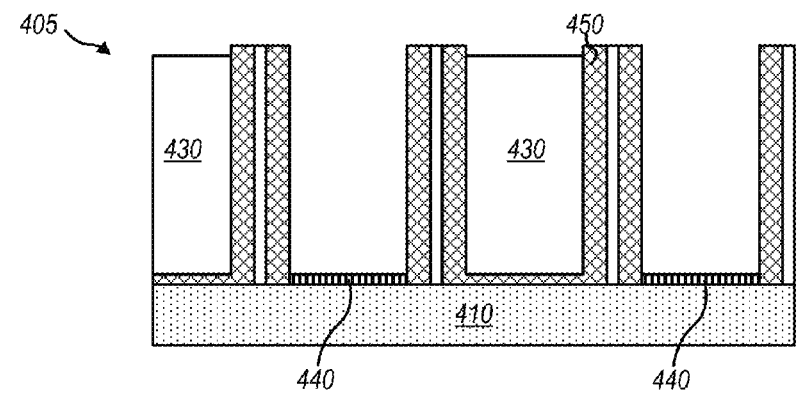

FIGS. 9A, 9B, 9C and 9D schematically show how the structure shown as wafer section 400 can be more successfully processed with a Si etch with tunable selectivity to oxide, according to embodiments herein. Thus, the following discussion begins with generating a plasma in a controlled flow of source gas that includes NH₃ and NF₃, to form a stream of plasma products, and adding a controlled flow of un-activated NH₃ to form an etch gas stream that interacts with the features of wafer section 400. FIG. 9A shows wafer section 400 (identical to that shown in FIG. 8A). FIG. 9B illustrates partial etching of wafer section 400 with the etch gas stream, to form a partially processed wafer section 403. The etch gas stream used to form wafer section 403 includes enough NH₃ to provide a nonzero oxide etch rate, that is, to make the etch only partially selective to poly over oxide. As shown in FIG. 9B, oxide traces 425 are etched along with poly 420 in this part of the etch process. Once the etch penetrates past oxide traces 425 (for example, after a time at which a measured or calculated etch rate ensures etching to or beyond the known maximum depth of oxide traces 425) NH₃ flow can be reduced to zero or near zero, to increase selectivity of poly over oxide. FIG. 9C illustrates partial etching of wafer section 400 with the etch, to form a partially processed wafer section 403. The etch proceeds in this manner until poly 420 is completely removed, as shown in wafer section 405, FIG. 9D. The high selectivity of the Si etch having tunable selectivity to oxide ensures that high-K oxide 440 is not damaged as poly 420 is removed.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the electrode" includes reference to one or more electrodes and equivalents thereof known to those skilled in the art, and so forth. Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

We claim:

1. A tunable plasma etch process, comprising:
    generating a plasma in a controlled flow of a source gas including NH₃ and NF₃ to form a stream of plasma products;
    controlling a flow of un-activated NH₃ that is added to the stream of plasma products to form an etch gas stream; and
    controlling pressure of the etch gas stream by adjusting at least one of the controlled flow of the source gas and the flow of un-activated NH₃ until the pressure is within a tolerance of a desired pressure;
    wherein an etch rate of at least one of polysilicon and silicon dioxide by the etch gas stream is adjustable by varying a ratio of the controlled flow of the source gas to the flow of un-activated NH₃.

2. The tunable plasma etch process of claim 1, wherein the etch rates of polysilicon and silicon dioxide by the etch gas stream are adjustable at least across a range of:

20:1 selectivity of the polysilicon etch rate over the silicon dioxide etch rate, to 2:1 selectivity of the polysilicon etch rate over the silicon dioxide etch rate.

3. The tunable plasma etch process of claim 1, wherein adjusting the ratio of the controlled flow of the source gas to the flow of un-activated $NH_3$, from 10:1 to 5:1 reduces the selectivity of the polysilicon etch rate over the silicon dioxide etch rate from 20:1 to 2:1.

4. The tunable plasma etch process of claim 1, wherein decreasing the ratio of the controlled flow of the source gas to the flow of un-activated $NH_3$ reduces a concentration of at least one of F and H radicals in the etch gas stream.

5. The tunable plasma etch process of claim 1, wherein a ratio of $NF_3$ to $NH_3$ in the source gas is greater than one.

6. The tunable plasma etch process of claim 1, wherein generating the plasma comprises generating a capacitively coupled plasma.

7. The tunable plasma etch process of claim 1, wherein the pressure is controllable at least across a range of 0.5 Torr to 10 Torr.

8. The tunable plasma etch process of claim 7, wherein the ratio of the controlled flow of the source gas to the flow of un-activated $NH_3$ is 5:1, the pressure is controlled to 6 Torr and the polysilicon and silicon dioxide etch rates are such that an etch selectivity of the tunable plasma etch process is about 3:1, silicon dioxide over poly.

9. The tunable plasma etch process of claim 1, further comprising adding oxygen to the source gas, prior to generating the plasma.

10. The tunable plasma etch process of claim 1, further comprising adding one of helium and argon to the source gas, prior to generating the plasma.

11. The tunable plasma etch process of claim 1, further comprising controlling a temperature of a workpiece on which the etch rates of the at least one of polysilicon and silicon dioxide are adjusted.

12. The tunable plasma etch process of claim 11, further comprising controlling the temperature of the workpiece within a range of 100 C to 125 C.

* * * * *